(12) United States Patent
Baum et al.

(10) Patent No.: US 6,686,533 B2
(45) Date of Patent: Feb. 3, 2004

(54) SYSTEM AND METHOD FOR CONVERTING SOLAR ENERGY TO ELECTRICITY

(75) Inventors: Avi Baum, Givataim (IL); Moshe Halfon, Tel Aviv (IL); Abraham Steinman, Nes Tziona (IL)

(73) Assignee: Israel Aircraft Industries Ltd., Ben Gurion Airport (IL)

( * ) Notice: Subject to any disclaimer, the term of this patent is extended or adjusted under 35 U.S.C. 154(b) by 53 days.

(21) Appl. No.: 10/060,093

(22) Filed: Jan. 29, 2002

(65) Prior Publication Data

US 2003/0140960 A1 Jul. 31, 2003

(51) Int. Cl.[7] .................. H01L 31/042; H01L 31/05
(52) U.S. Cl. .................. 136/244; 136/246; 257/432; 257/436; 257/443; 250/203.4; 438/65; 438/66; 438/80
(58) Field of Search .................. 136/244, 246; 257/432, 436, 443; 250/203.4; 438/65, 66, 80

(56) References Cited

U.S. PATENT DOCUMENTS

| | | | |
|---|---|---|---|
| 3,422,527 A | | 1/1969 | Gault |
| 4,021,267 A | * | 5/1977 | Dettling .................. 136/246 |
| 4,111,184 A | * | 9/1978 | Perkins .................. 126/577 |
| 4,162,174 A | | 7/1979 | Kaplow et al. |
| 4,175,249 A | | 11/1979 | Gruber |
| 4,238,820 A | | 12/1980 | Naaijer |
| 4,350,837 A | * | 9/1982 | Clark .................. 136/246 |
| 4,367,366 A | * | 1/1983 | Bloss et al. .................. 136/246 |
| 4,513,167 A | | 4/1985 | Brandstetter |
| 4,728,878 A | | 3/1988 | Anthony |
| 4,943,325 A | | 7/1990 | Levy |
| 5,289,998 A | | 3/1994 | Bingley et al. |
| 5,394,075 A | | 2/1995 | Ahrens et al. |
| 5,500,052 A | | 3/1996 | Horiuchi et al. |
| 5,505,789 A | | 4/1996 | Fraas et al. |
| 5,578,140 A | | 11/1996 | Yogev et al. |
| 5,644,219 A | | 7/1997 | Kurokawa |
| 5,677,833 A | | 10/1997 | Bingley |
| 5,684,385 A | | 11/1997 | Guyonneau et al. |
| 5,747,967 A | | 5/1998 | Muljadi et al. |
| 5,928,437 A | | 7/1999 | Dillard |
| 5,977,475 A | * | 11/1999 | Hibino .................. 136/246 |
| 6,015,950 A | * | 1/2000 | Converse .................. 136/246 |
| 6,020,553 A | | 2/2000 | Yogev |
| 6,031,179 A | | 2/2000 | O'Neill |
| 6,111,188 A | | 8/2000 | Kurokami et al. |
| 6,127,621 A | | 10/2000 | Simburger |
| 6,218,605 B1 | | 4/2001 | Dally et al. |
| 6,218,606 B1 | | 4/2001 | Morizane et al. |
| 6,225,793 B1 | | 5/2001 | Dickmann |
| 6,350,944 B1 | * | 2/2002 | Sherif et al. .................. 136/244 |
| 6,469,241 B1 | * | 10/2002 | Penn .................. 136/246 |

FOREIGN PATENT DOCUMENTS

WO    WO 00/33001    6/2000

OTHER PUBLICATIONS

Lewis et al, "Multi–Bandgap High Efficiency Converter (Rainbow)," Proceedings of the 32nd Intersociety Energy Conversion Engineering Conference, Honolulu, HI, vol. 1 (1997), pp. 401–406.*

* cited by examiner

*Primary Examiner*—Alan Diamond
(74) *Attorney, Agent, or Firm*—Testa, Hurwitz & Thibeault, LLP

(57) ABSTRACT

Energy converting system including a cell array and a light concentrating unit directing concentrated light at the cell array, the cell array including a plurality of cells, wherein the cells are coupled together according to the flux of the concentrated light which reaches each of the cells.

43 Claims, 29 Drawing Sheets

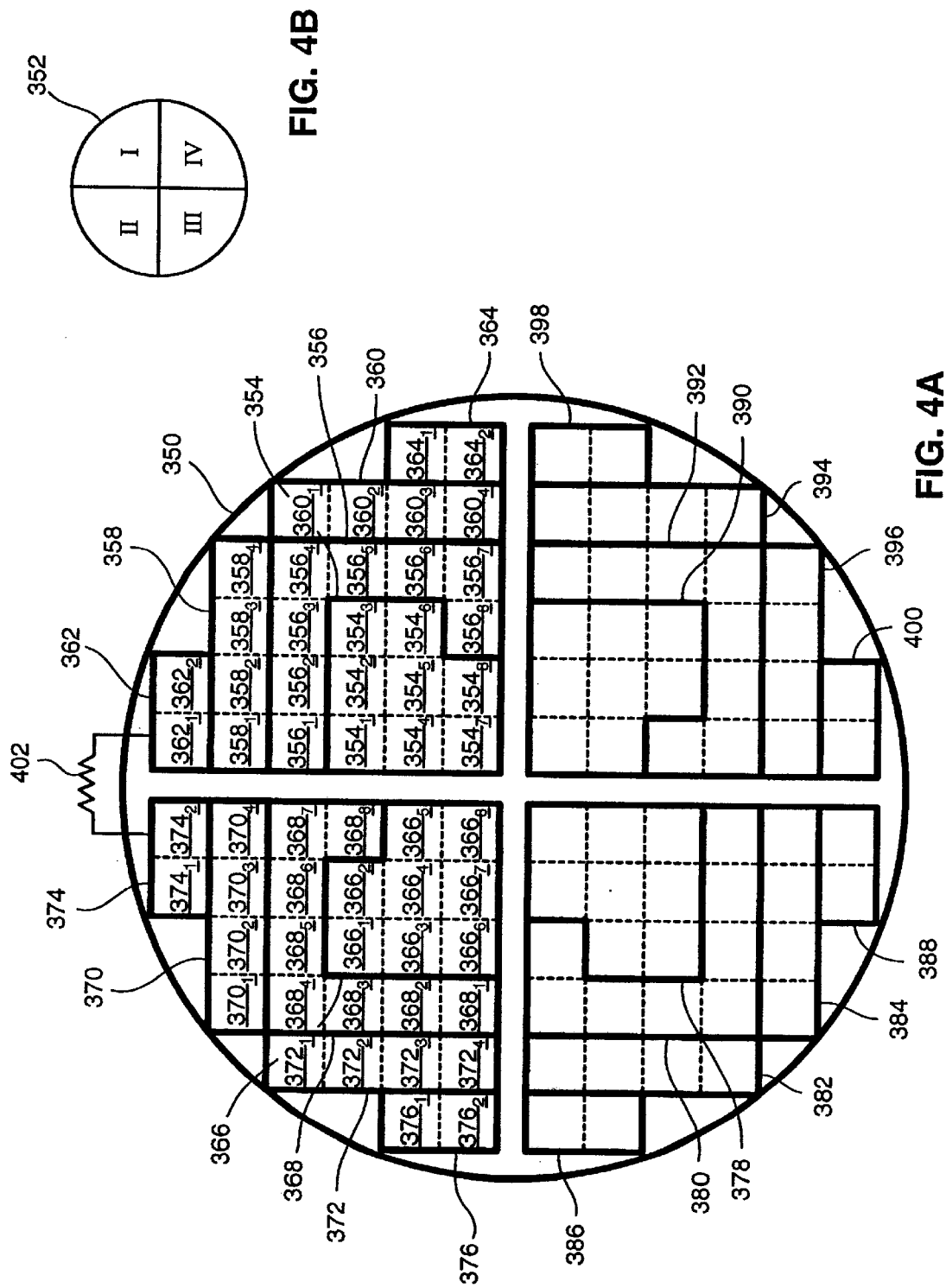

SYSTEM AND METHOD FOR CONVERTING SOLAR ENERGY TO ELECTRICITY

FIELD OF THE DISCLOSED TECHNIQUE

The disclosed technique relates to energy conversion in general, and to methods and systems for increasing the efficiency of photovoltaic cells, in particular.

BACKGROUND OF THE DISCLOSED TECHNIQUE

The solar radiation which reaches the Earth, is used to produce electrical power. Methods and systems of converting the solar radiation to electrical power are known in the art, such as heliothermal, heliochemical, helioelectrical, and the like.

In heliothermal processes the solar radiation is absorbed and converted to heat, which can be used for many purposes, such as house heating by warm air or water, cooling by absorption refrigeration, cooking, generating electricity by vapor cycles, and the like. In heliochemical processes the shorter wavelengths can cause chemical reactions, sustain growth of plants and animals, convert carbon dioxide to oxygen by photosynthesis, cause degradation of fabrics, plastics and paint, and the like. In helioelectrical processes part of the solar energy can be converted directly into electricity by photovoltaic cells.

A photovoltaic cell consists of a p-n junction formed in a wafer of monocrystalline material, such as silicon. The junction is formed parallel to the upper surface of the cell and this upper surface receives the incident radiation and produces current flow across the p-n junction. An array of these photovoltaic cells are formed on the wafer, coupled together in series, parallel, or a combination thereof, and the output leads are coupled across a load.

The material which photovoltaic cell is made of and the structure of the photovoltaic cell, determine an energy-gap, which characterizes the photovoltaic cell. This energy-gap, divided by the charge of an electron, defines the photovoltaic cell voltage, at which the photovoltaic cell produces electrical currents. The number of incident photons which are each of an energy, at least of the energy-gap, is proportional to the electrical current which is generated by the photovoltaic cell, at any given time. A photon whose energy is equal to or greater than the energy-gap, shall cause the photovoltaic cell to generate a current by one electron, at the voltage of the energy-gap divided by the electron charge.

If the energy of the photon is greater than the energy-gap, then the photovoltaic cell generates a current at the voltage of the energy-gap and the excess energy is converted to heat, thereby increasing the temperature of the photovoltaic cell. If the energy of the incident photon is equal to the energy-gap, then the photovoltaic cell generates a current at a single electron, and no heat is generated in the process. If the energy of the photon is below the energy-gap, then this photon has no contribution to power generation by the photovoltaic cell.

The current generated by the photovoltaic cell is proportional to the radiation flux (i.e., the number of photons reaching the surface of the photovoltaic cell per unit time, wherein the energy of the photons is equal to or greater than the energy-gap). Generally, the currents produced by the photovoltaic cells in the array are not equal to one another. For example, due to shadowing effect in a satellite, some of the photovoltaic cells receive less photons than others and thus, produce a smaller current. Other effects are due to the optical elements (e.g., lenses), which concentrate the light on the array, in a non-uniform manner.

In an array which includes power generating elements, such as batteries or photovoltaic cells coupled in series, when one of these elements fails, the resistance of that element increases and the power output of the array falls. Furthermore, if the power generating elements in the array produce different currents, then the current output of the array is equal to the lowest current produced by a power generating element in the array. Methods to mitigate this deficiency of photovoltaic cells are known in the art.

U.S. Pat. No. 4,943,325 issued to Levy and entitled "Reflector Assembly", is directed to a solar energy system for increasing the efficiency of a solar cell. The solar energy system includes a reflector assembly, a concentrator and a photovoltaic receiver. The concentrator has a dish-shaped, concave, parabolic configuration and concentrates the solar rays at a focal point. The photovoltaic receiver is located between the focal point and the concentrator. The reflector assembly is located on the photovoltaic receiver.

The surface of the photovoltaic receiver is generally a square. The concentrator concentrates the solar rays on the surface of the photovoltaic receiver, as a circular image. The surface area and the diameter of the circular image are greater than the surface area and the side, respectively, of the square surface of the photovoltaic receiver. The circular image includes four marginal portions, each defined by the intersections of a side of the photovoltaic receiver and an arc of the circular image. The marginal portions lie outside the photovoltaic receiver. Hence, the solar rays in the marginal portions fall outside the photovoltaic receiver and do not contribute to the production of electric energy. The photovoltaic receiver includes four corner portions, each of which is formed by the intersection of two sides of the photovoltaic receiver at a corner thereof and an arc of the circular image. These corner portions are outside the circular image and therefore, the photovoltaic receiver receives no solar ray at these corner portions.

The reflector assembly includes four reflector subassemblies. Each reflector subassembly includes a pair of reflector elements. Each pair of reflector elements is located on each marginal portion. Each reflector element originates from the intersection of the side of the photovoltaic receiver with the arc of the circular image on the marginal portion and converges with the other reflector element in the pair, thus forming an apex. The apex is located between the photovoltaic receiver and the concentrator. The reflective surface of each reflective element is bicurved and concave in two directions, such that the solar rays which would otherwise strike the marginal portions, are reflected to the corner portions.

U.S. Pat. No. 4,162,174 issued to Kaplow et al. and entitled "Solar Cell Array", is directed to a system for increasing the electrical power generated by a photovoltaic cell. The photovoltaic cell has a square configuration, while the incident light is generally circular. The photovoltaic cell includes a plurality of solar cell segments and each solar cell segment includes a plurality of unit solar cells. The length of each solar cell segment is inversely proportional to the distance of the solar cell segment from the center of the circular image of the incident light. The unit solar cells are coupled together in series and the solar cell segments are coupled in parallel to a load.

U.S. Pat. No. 6,020,553 issued to Yogev and entitled "Photovoltaic Cell System and an Optical Structure Therefor", is directed to an optical structure for increasing the electrical power produced by a photovoltaic cell. The optical structure is a transparent three dimensional body, having a bottom surface upon which light impinges and a top surface from which the light rays emerge. An array of cell-attaching active areas is formed on the top surface, wherein each cell-attaching active area includes a non-imaging light radiation concentrator. Each individual cell of the photovoltaic cell is placed on the area portion of the respective concentrator. The geometry of each concentrator is such that the light impinging on the bottom surface, is internally reflected and emerges from the surface of the concentrator in alignment with the active portion of the respective individual cell.

U.S. Pat. No. 4,513,167 issued to Brandstetter and entitled "Arrays of Polarized Energy-Generating Elements", is directed to a method of interconnecting an array of polarized energy-generating elements, such that the output of the array remains constant, when one or more energy-generating elements fail. The polarized energy-generating elements are arranged in a matrix, such that the elements in each row and column are polarized in the same direction.

According to this method, the positive pole of each element in each column is coupled with the negative pole of the adjacent element in the column. The positive pole of each second element in a column is coupled with the positive pole of the corresponding element (i.e., the element in the same row) of one of the two adjacent columns. The positive pole of each alternate second element in a column is coupled with the positive pole of the corresponding element (i.e., the element in the same row) in the other of the two adjacent columns.

U.S. Pat. No. 5,928,437 issued to Dillard and entitled "Microarray for Efficient Energy Generation for Satellites", is directed to a microarray of photovoltaic cells for reducing the effect of shadowing in the solar power system of a satellite. The microarray includes a rear interconnect, an optional substrate, a solar cell junction and a front interconnect. The solar cell junction includes an array of small solar cells coupled together in series. The optional substrate provides structural support during manufacture. The optional substrate includes a plurality of through-holes. The rear interconnect includes a plurality of rear interconnect pads and the front interconnect includes a plurality of front interconnect pads.

The rear interconnect, the optional substrate, the solar junction and the front interconnect are assembled, such that the through-holes are aligned with the rear interconnect pads and the front interconnect pads. The through-holes provide passages for soldering the rear interconnect pads to the front interconnect pads. The rear interconnect and the front interconnect provide series and parallel electrical coupling between the individual solar cells of the solar cell junction. The microarray covers small, irregularly shaped, or non-planar surfaces of satellites.

SUMMARY OF THE DISCLOSED TECHNIQUE

It is an object of the disclosed technique to provide a novel method and system for converting solar energy to electricity, which overcomes the disadvantages of the prior art.

In accordance with one aspect of the disclosed technique, there is thus provided an energy converting system which includes a cell array and a light concentrating unit directing concentrated light at the cell array. The cell array includes a plurality of cells, wherein the cells are coupled together according to the flux of the concentrated light which reaches each of the cells. Thus, the cells which receive light of substantially the same flux, are coupled together. Since the output current of a group of cells is limited by the cell whose output current is the lowest, the current loss in each group of cells thus coupled together, is substantially low and the power output thereof is substantially high.

In accordance with another aspect of the disclosed technique, there is thus provided a method for coupling together a plurality of cells in a cell array. The method includes the procedure of determining a lowest one of a plurality of cell flux values of the cells, in each of a plurality of groups, of each one of a plurality of array architectures. The method further includes a procedure of determining the difference between the lowest cell flux value in each of the groups, and each of the other cell flux values in the group. The method further includes the procedures of determining the sum of the differences for each of the array architectures and selecting an array architecture having a lowest one of the sums.

In accordance with a further aspect of the disclosed technique, there is thus provided a method for coupling together a plurality of cells in a cell array. The method includes the procedure of determining the sum of a plurality of cell flux values of the cells, in each of a plurality of groups of each one of a plurality of array architectures. The method further includes the procedure of determining one of the groups in each one of the array architectures, the group having a lowest sum of the cell flux values. The method further includes the procedure of determining the difference between the lowest sum and the sums in other groups of each one of the array architectures. The method further includes the procedures of determining the sum of the differences in each of the array architectures and selecting an array architecture having a lowest sum of the differences.

BRIEF DESCRIPTION OF THE DRAWINGS

The disclosed technique will be understood and appreciated more fully from the following detailed description taken in conjunction with the drawings in which:

FIG. 4A is a schematic illustration of a plurality of cells embedded in a cell array, constructed and operative in accordance with another embodiment of the disclosed technique;

FIG. 4B is a schematic illustration of the four quadrants of a circle;

DETAILED DESCRIPTION OF THE EMBODIMENTS

The disclosed technique overcomes the disadvantages of the prior art by coupling the photovoltaic cells, according to the flux of a concentrated light which illuminates each cell. The cells which receive light of the same flux, are grouped together and all the cells in a group produce the same current. Thus, the output current of a group of cells is proportional to the flux of the concentrated light which illuminates this group, and this output current is not limited by a low-current-producing cell, which would otherwise be coupled with this group.

The term "cell" herein below, refers to a single photovoltaic cell. The term "group" refers to a plurality of cells, having the same flux, which are coupled together. The term "sub-group" herein below, refers to a group of cells which all receive a concentrated light having the same flux, wherein not all of these cells are necessarily coupled together. A group can include a plurality of sub-groups, which are coupled together. The term "low-current-producing cell" herein below, refers to a cell whose output current falls due to reduction in the flux of light reaching the cell, or due to a malfunction in the cell. A low-current-producing cell can produce a lower current, when there is a fall in the flux of light which reaches the cell, when the cell malfunctions.

The term "low-current-producing group" herein below, refers to a group which includes one or more low-current-producing cells or a dead cell whose output power is zero. The term "light" herein below, refers to a concentrated light which is focused on the photovoltaic cell array, by a focusing element, such as lens, lens assembly, one mirror, a plurality of mirrors, light guide, and the like. The mirror can be concave (known in the art as "dish"), in which case it is in form of a paraboloid, hyperboloid, catenary of revolution, and the like. The term "iso-flux regions" herein below, refers to different regions of a cell array where the light falling thereon, is of substantially the same flux.

Figure 1A:
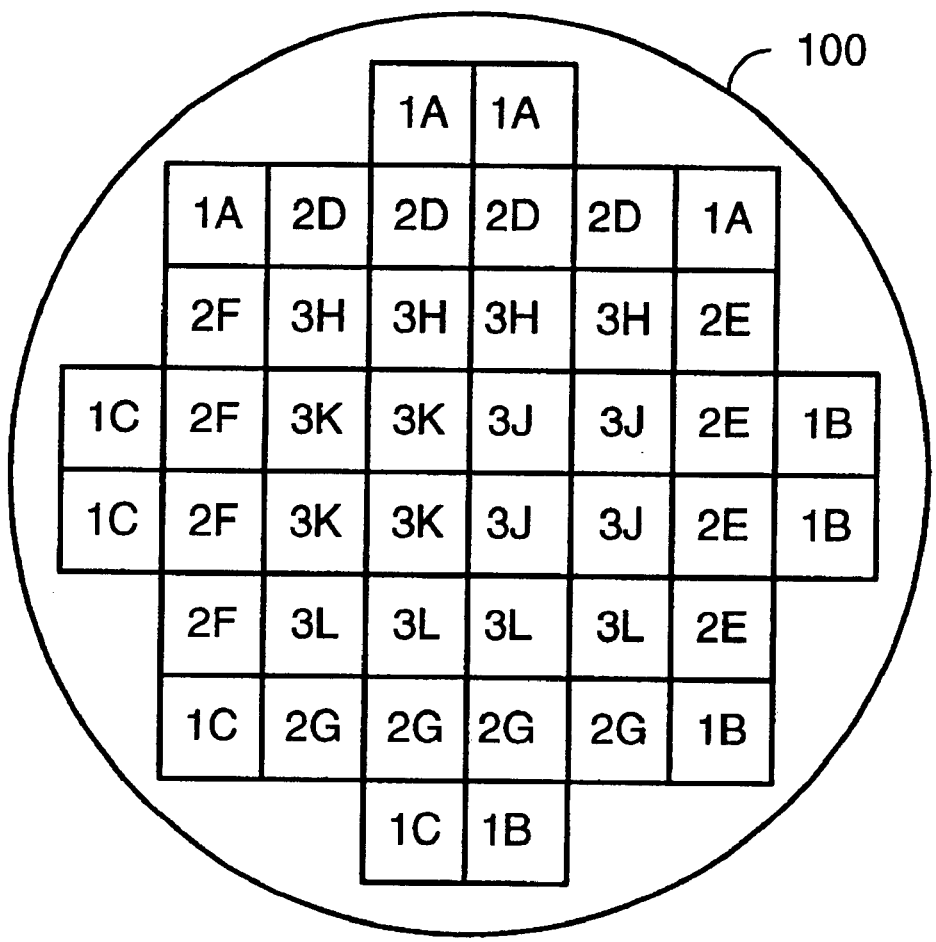
FIG. 1A is a schematic illustration of a plurality of cells on a cell array, constructed and operative in accordance with an embodiment of the disclosed technique.
Figure 1B:
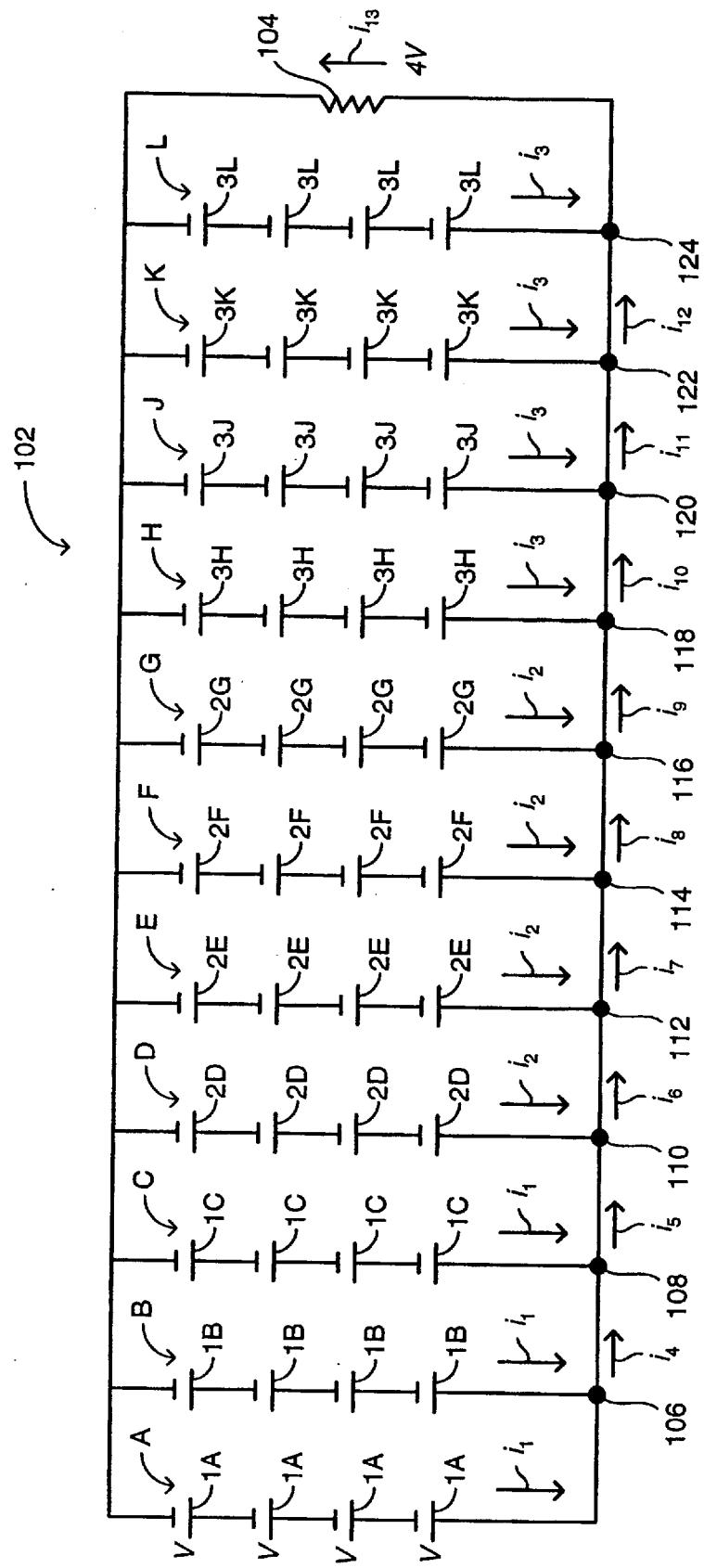
FIG. 1B is a schematic illustration of a circuit in which the cells of FIG. 1A are coupled with a load.

Reference is now made to FIGS. 1A and 1B. FIG. 1A is a schematic illustration of a plurality of cells on a cell array, generally referenced 100, constructed and operative in accordance with an embodiment of the disclosed technique. FIG. 1B is a schematic illustration of the cells of FIG. 1A, coupled with a load, in a circuit generally referenced 102.

With reference to FIG. 1A, cell array 100 includes four cells designated 1A, four cells designated 1B, four cells designated 1C, four cells designated 2D, four cells designated 2E, four cells designated 2F, four cells designated 2G, four cells designated 3H, four cells designated 3J, four cells designated 3K and four cells designated 3L. The numeral in each reference, designates the flux of light which reaches the cell and the letter designates the group to which the cell belongs.

For example, 1B indicates that this cell belongs to group B and the light which illuminates this cell, has a flux of for example, 500 kW/m². Cell 1C also receives light with flux of 500 kW/m², but it belongs to group C. Group A includes four cells, each designated 1A, group B includes four cells, each designated 1B and group C includes four cells, each designated 1C.

The voltage generated by each cell depends on the material structure of the cell (i.e., the energy-gap). Since all cells of cell array 100 are constructed of the same material and the wavelength of the light is uniform throughout, all cells generate substantially the same voltage V (FIG. 1B). The current across a cell is a function of the flux of the light which reaches the cell. Therefore, the cells whose numeral designations are the same (i.e., the cells which receive light of the same flux), produce the same current.

For example, each of the four cells 1A, each of the four cells 1B and each of the four cells 1C, produces the same current $i_1$, because each of these cells receives light with the same flux of 500 kW/m² (as indicated by the numeral "1"). Each of the four cells 2D, each of the four cells 2E, each of the four cells 2F and each of the four cells 2G, produces the same current $i_2$. Each of the four cells 3H, each of the four cells 3J, each of the four cells 3K and each of the four cells 3L, produces the same current $i_3$.

With reference to FIG. 1B, the cells in each group are coupled together in series. For example, the four cells 2D of group D, are coupled together in series. The groups are coupled in parallel to a load 104. For example, the four serially coupled cells 1B, are coupled in parallel to the four serially coupled cells 2F and to load 104. Groups A, B, C, D, E, F, G, H, J, K and L are coupled in parallel to load 104, at nodes 106, 108, 110, 112, 114, 116, 118, 120, 122 and 124. These nodes are all the same node, because they all meet at the same junction. However, each of the nodes 106, 108, 110, 112, 114, 116, 118, 120, 122 and 124 is designated as such, in order to describe the current flows in circuit 102.

According to Kirchhoff's current law, the algebraic sum of the currents into a node at any instant, is equal to zero. Since the four cells 1A are coupled in series and the four cells 1B are coupled in series, a current $i_1$ flows from group A to node 106 and a current $i_1$ flows from group B to node 106 Thus, at node 106, $$i_1 + i_1 - i_4 = 0 \tag{2}$$

hence, $$i_4 = 2i_1 \tag{3}$$

Group C produces a current $i_1$. Therefore, at node 108, $$i_5 = i_1 + i_4 \tag{4}$$

Combining Equations (3) and (4), yields $$i_5 = 3i_1 \tag{5}$$

Each of the groups D, E, F and G produces a current $i_2$. Each of groups H, J, K and L produces a current $i_3$. Therefore, at each of the nodes 110, 112, 114, 116, 118, 120, 122 and 124, respectively, the following relations hold:

$$i_6 = 3i_1 + i_2 \tag{6}$$

$$i_7 = 3i_1 + 2i_2 \tag{7}$$

$$i_8 = 3i_1 + 3i_2 \tag{8}$$

$$i_9 = 3i_1 + 4i_2 \tag{9}$$

$$i_{10} = 3i_1 + 4i_2 + i_3 \tag{10}$$

$$i_{11} = 3i_1 + 4i_2 + 2i_3 \tag{11}$$

$$i_{12} = 3i_1 + 4i_2 + 3i_3 \tag{12}$$

and the current flowing through load 104 is, $$i_{13} = 3i_1 + 4i_2 + 4i_3 \tag{13}$$

Since the cells in a group are coupled in series, the voltage generated by each group is equal to the sum of the voltages generated by each cell. Each cell produces a voltage V. Hence, each group produces a voltage 4V. Since the groups are coupled in parallel to load 104, the voltage across load 104 is 4V. The power output of the cells of cell array 100, as coupled together in circuit 102 is $$P = 4i_{13} \tag{14}$$

Figure 2:
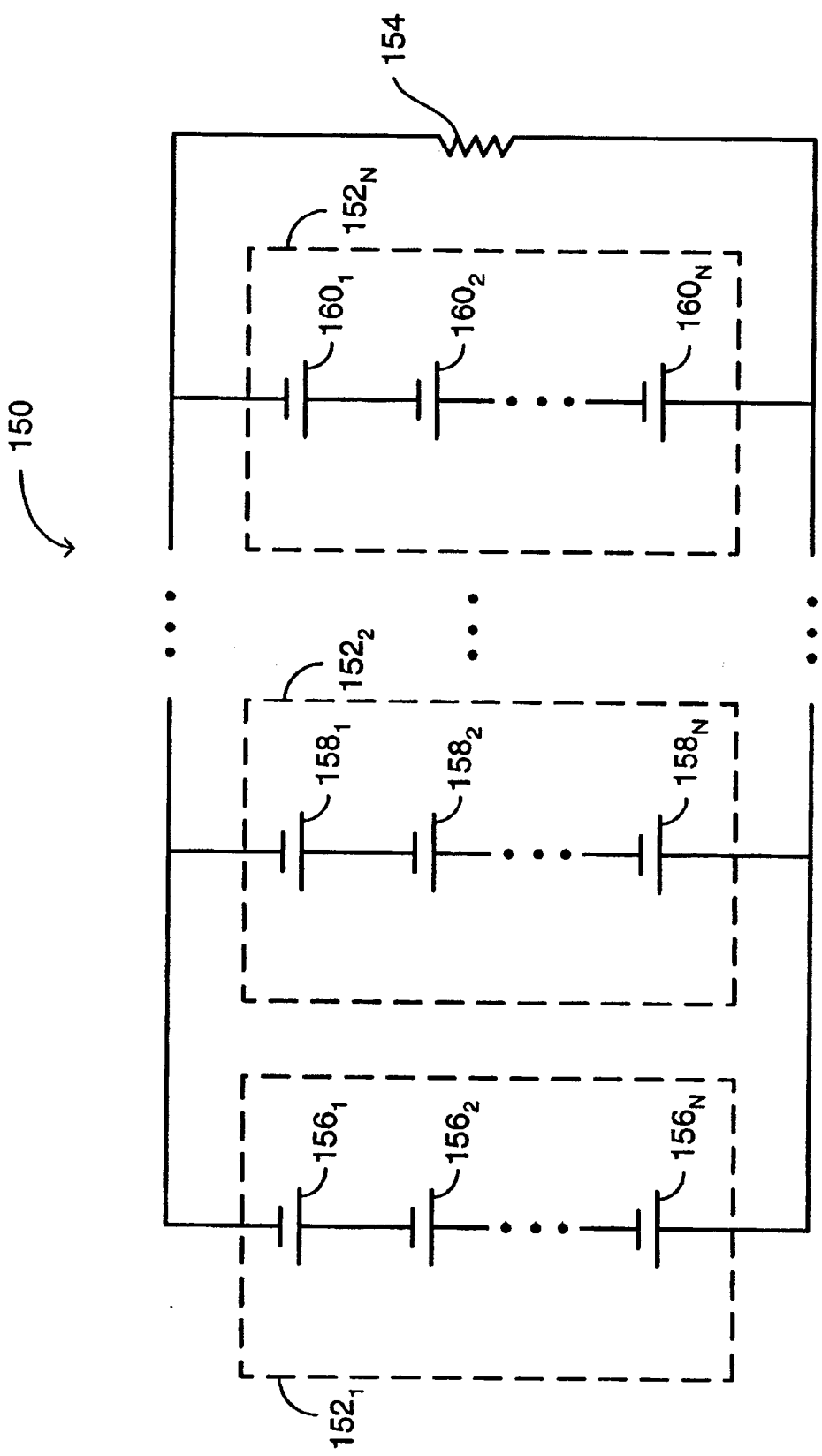
FIG. 2 is a schematic illustration of a circuit including a plurality of cells, constructed and operative in accordance with another embodiment of the disclosed technique.

Reference is now made to FIG. 2, which is a schematic illustration of a circuit including a plurality of cells, generally referenced 150, constructed and operative in accordance with another embodiment of the disclosed technique. Circuit 150 includes a plurality of groups $152_1$, $152_2$ and $152_N$. Groups $152_1$, $152_2$ and $152_N$ are coupled in parallel to a load 154. Group $152_1$ includes a plurality of cells $156_1$, $156_2$ and $156_N$ coupled together in series. Group $152_2$ includes a plurality of cells $158_1$, $158_2$ and $158_N$ coupled together in series. Group $152_N$ includes a plurality of cells $160_1$, $160_2$ and $160_N$ coupled together in series.

Figure 3:
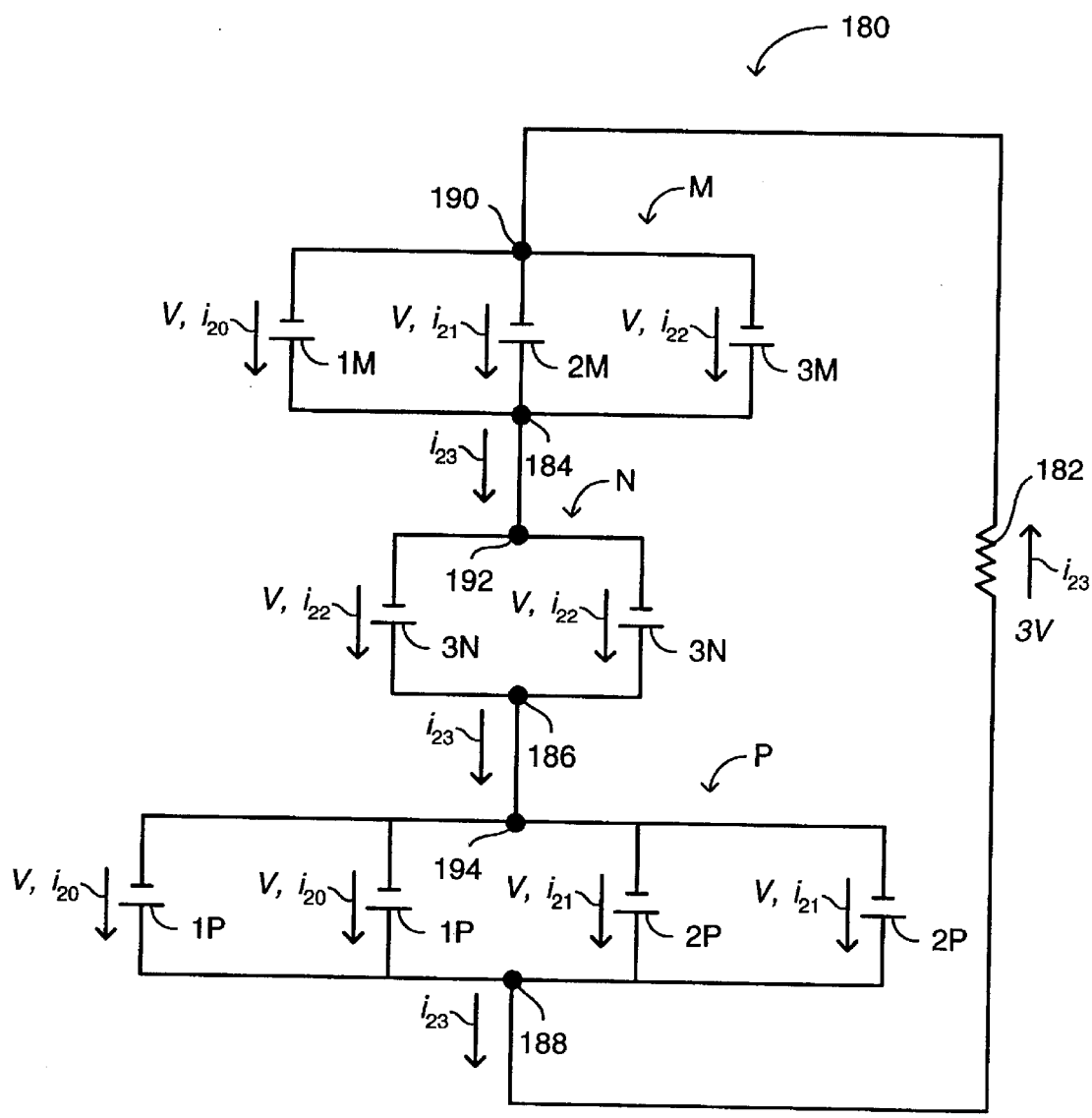
FIG. 3 is a schematic illustration of a circuit including three groups, constructed and operative in accordance with a further embodiment of the disclosed technique.

Reference is now made to FIG. 3, which is a schematic illustration of a circuit including three groups, generally referenced 180, constructed and operative in accordance with a further embodiment of the disclosed technique. Circuit 180 includes groups M, N and P. Group M includes cells 1M, 2M and 3M. Group N includes two cells 3N. Group P includes two cells 1P and two cells 2P.

Groups M, N and P are coupled in series to a load 182. Cells 1M, 2M and 3M of group M are coupled together in parallel. The two cells 3N of group N are coupled together in parallel. The two cells 1P and the two cells 2P are coupled together in parallel.

Since cells 1M and 1P carry the same numeral "1", the light which reaches each of the cells 1M and 1P has the same flux, and hence each of the cells 1M and 1P produces the same current $i_{20}$. Similarly, each of the cells 2M and 2P produces the same current $i_{21}$, and each of the cells 3M and 3N produces the same current $i_{21}$. Cells 1M, 2M, 3M, the two cells 3N, the two cells 1P and the two cells 2P, are arranged in groups M, N and P, respectively, such that the sum of currents produced by the cells in one group, is equal to the sum of currents produced by the cells in another group.

Thus, applying Kirchhoff's current law to nodes 184, 186 and 188, yields the following relation:

$$i_{20} + i_{21} + i_{22} = 2i_{22} = 2i_{20} + 2i_{21} = i_{23} \tag{15}$$

For example, if $i_{20} = 100$ mA, $i_{21} = 200$ mA and $i_{22} = 300$ mA, then $i_{20} + i_{21} + i_{22} = 600$ mA, $2i_{22} = 600$ mA, $2i_{20} + 2i_{21} = 600$ mA and thus, $i_{23}$=600 mA. According to this arrangement of cells into groups, all the groups produce the same current and therefore, the current flowing through load 182 is not restricted to the lowest current produced by a low-current-producing group in circuit 180.

The light which reaches each of the cells 1M, 2M, 3M, the two cells 3N, the two cells 1P and the two cells 2P, is of the same wavelength. Therefore, each of the cells 1M, 2M, 3M, the two cells 3N, the two cells 1P and the two cells 2P, produces the same voltage V. Since the cells in each of the groups M, N and P are coupled together in parallel, the voltage across each pair of the nodes 190 and 184, 192 and 186, and 194 and 188, is V. Since the groups M, N and P are coupled in series to load 182, the voltage across load 182 is 3V.

$$P=3i_{23} \tag{16}$$

It is noted that the number of groups in circuit 180 is not restricted to three and that any number of groups such as groups M, N and P, can be coupled in series to a load.

Figure 4C:
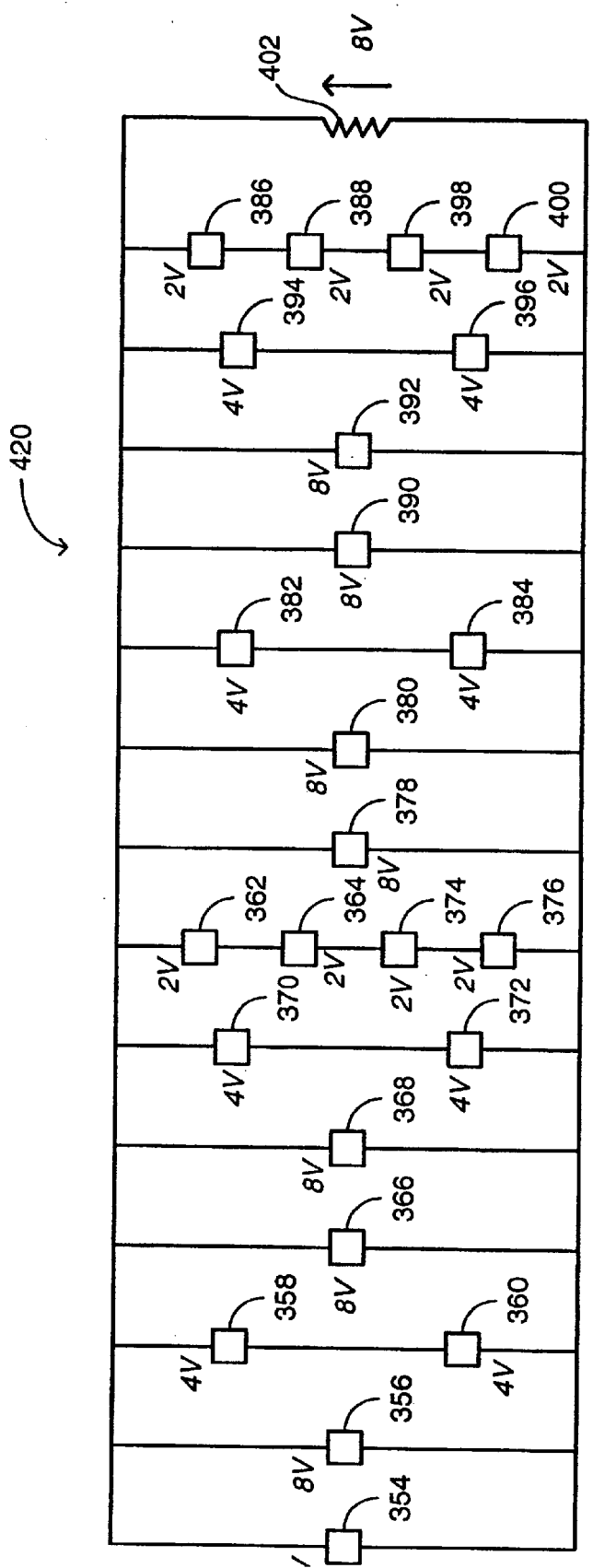
FIG. 4C is a schematic illustration of a circuit, in which the groups and the sub-groups of FIG. 4A are coupled with a load.

Reference is now made to FIGS. 4A, 4B and 4C. FIG. 4A is a schematic illustration of a plurality of cells embedded in a cell array, generally referenced 350, constructed and operative in accordance with another embodiment of the disclosed technique. FIG. 4B is a schematic illustration of the four quadrants of a circle, generally referenced 352. FIG. 4C is a schematic illustration of a circuit, generally referenced 420, in which the groups and the sub-groups of FIG. 4A are coupled with a load.

Cell array 350 is round, however the cell array can be manufactured in a polygonal shape, such as hexagon, square, and the like. Cell array 350 is divided to four quadrants I, II, III and IV, as illustrated in circle 352 of FIG. 4B. Quadrant I of cell array 350 includes groups 354 and 356, and sub-groups 358, 360, 362 and 364. Quadrant II of cell array 350 includes groups 366 and 368, and sub-groups 370, 372, 374 and 376. Quadrant III of cell array 350 includes groups 378 and 380, and sub-groups 382, 384, 386 and 388. Quadrant IV of cell array 350 includes groups 390 and 392, and sub-groups 394, 396, 398 and 400. The boundaries of the groups and the sub-groups in FIG. 4A are indicated by thick lines, whereas the boundaries of the cells in each group and sub-group are designated by broken lines.

Group 354 includes cells $354_1$, $354_2$, $354_3$, $354_4$, $354_5$, $354_6$, $354_7$ and $354_8$. Group 356 includes cells $356_1$, $356_2$, $356_3$, $356_4$, $356_5$, $356_6$, $356_7$ and $356_8$. Sub-group 358 includes cells $358_1$, $358_2$, $358_3$ and $358_4$. Subgroup 360 includes cells $360_1$, $360_2$, $360_3$ and $360_4$. Sub-Group 362 includes cells $362_1$ and $362_2$. Sub-group 364 includes cells $364_1$ and $364_2$.

Group 366 includes cells $366_1$, $366_2$, $366_3$, $366_4$, $366_5$, $366_6$, $366_7$ and $366_8$. Group 368 includes cells $368_1$, $368_2$, $368_3$, $368_4$, $368_5$, $368_6$, $368_7$ and $368_8$. Sub-group 370 includes cells $370_1$, $370_2$, $370_3$ and $370_4$. Sub-group 372 includes cells $372_1$, $372_2$, $372_3$ and $372_4$. Sub-group 374 includes cells $374_1$ and $374_2$. Sub-group 376 includes cells $376_1$ and $376_2$.

The number of cells included in each of the groups 378 and 380, and each of the sub-groups 382, 384, 386 and 388, is equal to the number of cells included in each of the groups 354 and 356, and each of the sub-groups 358, 360, 362 and 364, respectively. The number of cells included in each of the groups 390 and 392, and each of the sub-groups 394, 396, 398 and 400, is equal to the number of cells included in each of the groups 354 and 356, and each of the sub-groups 358, 360, 362 and 364, respectively.

Cells $354_1$, $354_2$, $354_3$, $354_4$, $354_5$, $354_6$, $354_7$ and $354_8$ are coupled together in series. Cells $356_1$, $356_2$, $356_3$, $356_4$, $356_5$, $356_6$, $356_7$ and $356_8$ are coupled together in series. Cells $358_1$, $358_2$, $358_3$ and $358_4$ are coupled together in series. Cells $360_1$, $360_2$, $360_3$ and $360_4$ are coupled together in series. Cells $362_1$ and $362_2$ are coupled together in series. Cells $364_1$ and $364_2$ are coupled together in series.

Cells $366_1$, $366_2$, $366_3$, $366_4$, $366_5$, $366_6$, $366_7$ and $366_8$ are coupled together in series. Cells $368_1$, $368_2$, $368_3$, $368_4$, $368_5$, $368_6$, $368_7$ and $368_8$ are coupled together in series. Cells $370_1$, $370_2$, $370_3$ and $370_4$ are coupled together in series. Cells $372_1$, $372_2$, $372_3$ and $372_4$ are coupled together in series. Cells $374_1$ and $374_2$ are coupled together in series. Cells $376_1$ and $376_2$ are coupled together in series.

The couplings between the cells in each of the groups 378 and 380, and in each of the sub-groups 382, 384, 386 and 388, are similar to the couplings between the cells in each of the groups 354 and 356, and in each of the sub-groups 358, 360, 362 and 364, respectively. The couplings between the cells in each of the groups 390 and 392, and in each of the sub-groups 394, 396, 398 and 400, are similar to the couplings between the cells in each of the groups 354 and 356, and in each of the sub-groups 358, 360, 362 and 364, respectively.

The cells in cell array 350 are divided to groups and sub-groups, as described herein above. The boundaries of each group or each sub-group, define an area on cell array 350, which is exposed to light of an approximately uniform flux. Thus, all the cells included in a group or in a sub-group, are exposed to light of substantially the same flux, and the output current of these cells is substantially the same. For example, groups 354, 366, 378 and 390 are located in a region within cell array 350, which is illuminated by light of substantially the same flux. Thus, each of the cells $354_1$, $354_2$, $354_3$, $354_4$, $354_5$, $354_6$, $354_7$, $354_8$, $366_1$, $366_2$, $366_3$, $366_4$, $366_5$, $366_6$, $366_7$ and $366_8$, and each of the cells included in groups 378 and 390, produces substantially the same current. Groups 356, 368, 380 and 392 are exposed to light of substantially the same flux. Sub-groups 358, 360, 370, 372, 382, 384, 394 and 396 are exposed to light of substantially the same flux. Sub-groups 362, 364, 374, 376, 386, 388, 398 and 400 are exposed to light of substantially the same flux.

All the cells embedded in cell array 350 are exposed to light of the same wavelength. Therefore, the electric potential across the cells is substantially the same, and each cell produces a voltage V.

The following description pertains to quadrants I and II of cell array 350. Since the cells in each of the sub-groups 362, 364, 374 and 376 are coupled together in series, each of the groups 362, 364, 374 and 376 produces a voltage 2V. Sub-groups 362, 364, 374 and 376 are coupled together in series. Thus, the electrical potential across the serially coupled cells of sub-groups 362, 364, 374 and 376 is 8V.

Since the cells in each of the sub-groups 358 and 360 are coupled together in series, each of the sub-groups 358 and 360 produces a voltage 4V. Sub-groups 358 and 360 are coupled together in series. Thus, the electrical potential across the serially coupled cells of sub-groups 358 and 360 is 8V.

Since the cells in each of the sub-groups 370 and 372 are coupled together in series, each of the sub-groups 370 and 372 produces a voltage 4V. Sub-groups 370 and 372 are coupled together in series. Thus, the electrical potential across the serially coupled cells of sub-groups 370 and 372 is 8V. Each of the groups 354, 356, 366 and 368 includes eight cells, each cell produces a voltage of V and the cells are coupled together in series. Thus, the electrical potential across the serially coupled cells of each of the groups 354, 356, 366 and 368 is 8V.

The following description pertains to quadrants III and IV of cell array 350, and it is similar to the description concerning quadrants I and II herein above. Sub-groups 386, 388, 398 and 400 are coupled together in series. Sub-groups 382 and 384 are coupled together in series. Sub-groups 394 and 396 are coupled together in series. The electrical potential across the serially coupled cells of sub-groups 386, 388, 398 and 400 is 8V. The electrical potential across the serially coupled cells of sub-groups 382 and 384 is 8V. The electrical potential across the serially coupled cells of sub-groups 394 and 396 is 8V. Since each of the groups 378, 380, 390 and 392 includes eight cells, the electric potential across the serially coupled cells of each of the groups 378, 380, 390 and 392 is 8V. It is noted that division of cell array 350 into groups of cells, and the couplings between the cells in each group, is not limited to the example set forth in FIG. 4A, and that other divisions and other couplings are possible.

With reference to FIG. 4C, the four serially coupled sub-groups 362, 364, 374 and 376, the four serially coupled sub-groups 386, 388, 398 and 400, and each pair of serially coupled sub-groups 358 and 360, 370 and 372, 382 and 384, and 394 and 396, are coupled in parallel to groups 354, 356, 366, 368, 378, 380, 390 and 392, and to a load 402. Hence, the voltage across load 402 is 8V and the current flowing through load 402 can be calculated by analyzing circuit 420.

By dividing the cells of cell array 350 into groups and sub-groups, and coupling together the groups and the sub-groups as in circuit 420, the cells which produce the same current are grouped together. Thus, the influence of a low-current-producing cell in restricting the current flowing through load 402, to the current produced by the low-current-producing cell, is substantially minimized. It is noted that circuit 420 is not unique to the disclosed technique, and that the cells embedded in cell array 350 can be coupled together according to other circuits known in the art.

Figure 5:
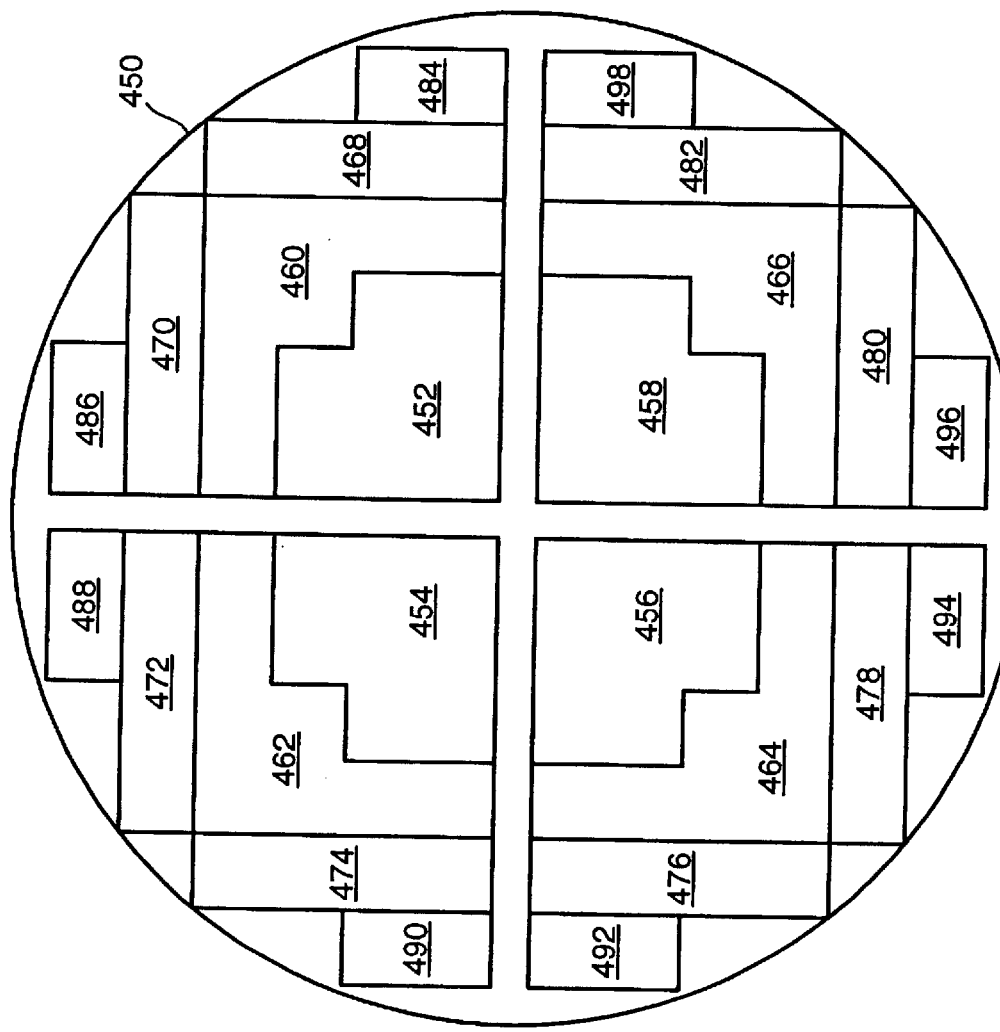
FIG. 5 is a schematic illustration of a plurality of groups and sub-groups in a cell array, constructed and operative in accordance with a further embodiment of the disclosed technique.

Reference is now made to FIG. 5, which is a schematic illustration of a plurality of groups and sub-groups in a cell array, generally referenced 450, constructed and operative in accordance with a further embodiment of the disclosed technique. The cells (not shown) embedded in cell array 450 are divided to the following groups and sub-groups: 452, 454, 456, 458, 460, 462, 464, 466, 468, 470, 472, 474, 476, 478, 480, 482, 484, 486, 488, 490, 492, 494, 496 and 498.

Each of the groups 452, 454, 456 and 458 is exposed to light of substantially the same flux. Each of the groups 460, 462, 464 and 466 is exposed to light of substantially the same flux. Each of the sub-groups 468, 470, 472, 474, 476, 478, 480 and 482 is exposed to light of substantially the same flux. Each of the sub-groups 484, 486, 488, 490, 492, 494, 496 and 498 is exposed to light of substantially the same flux.

Figure 6A:
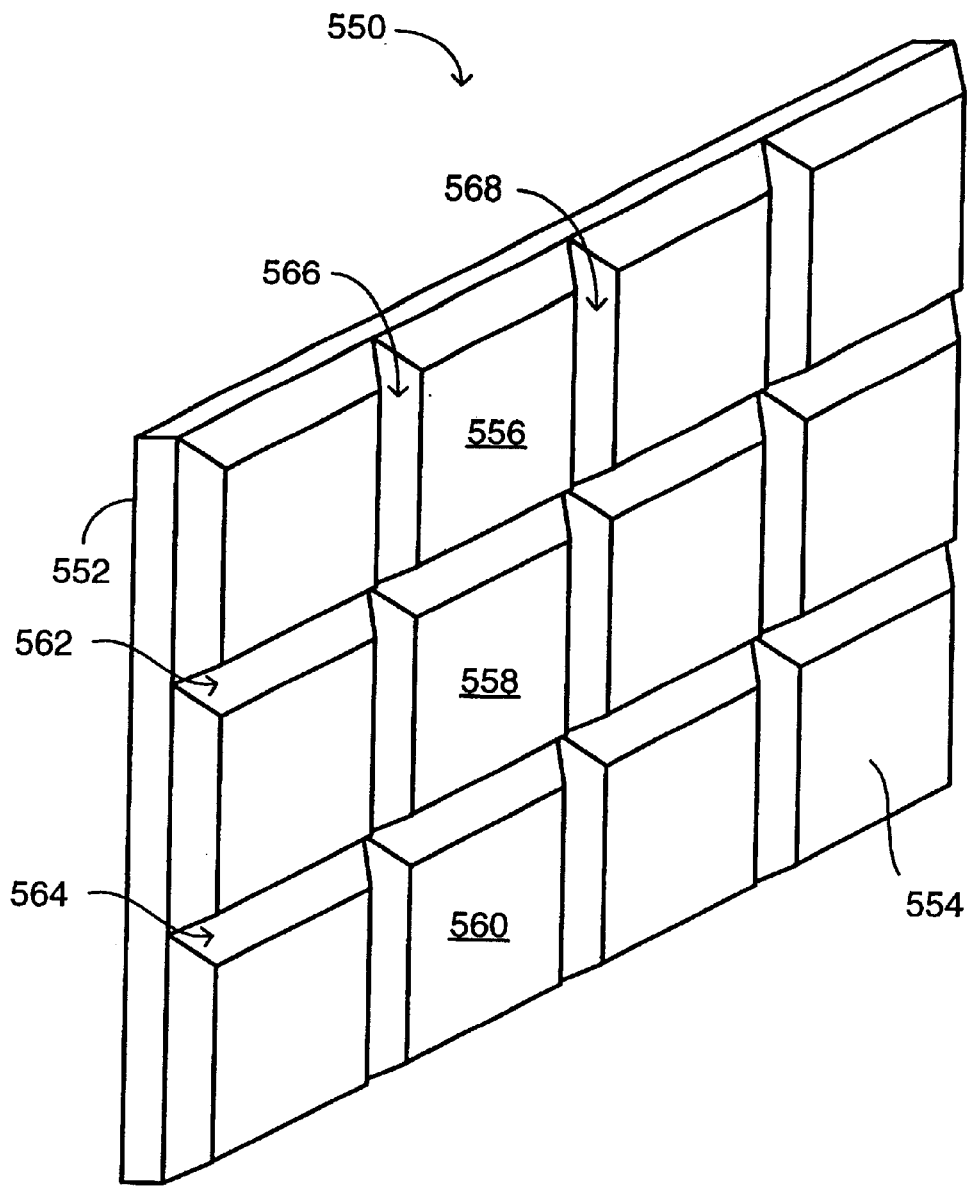
FIG. 6A is a schematic illustration of a light concentrator, constructed and operative in accordance with another embodiment of the disclosed technique.
Figure 6B:
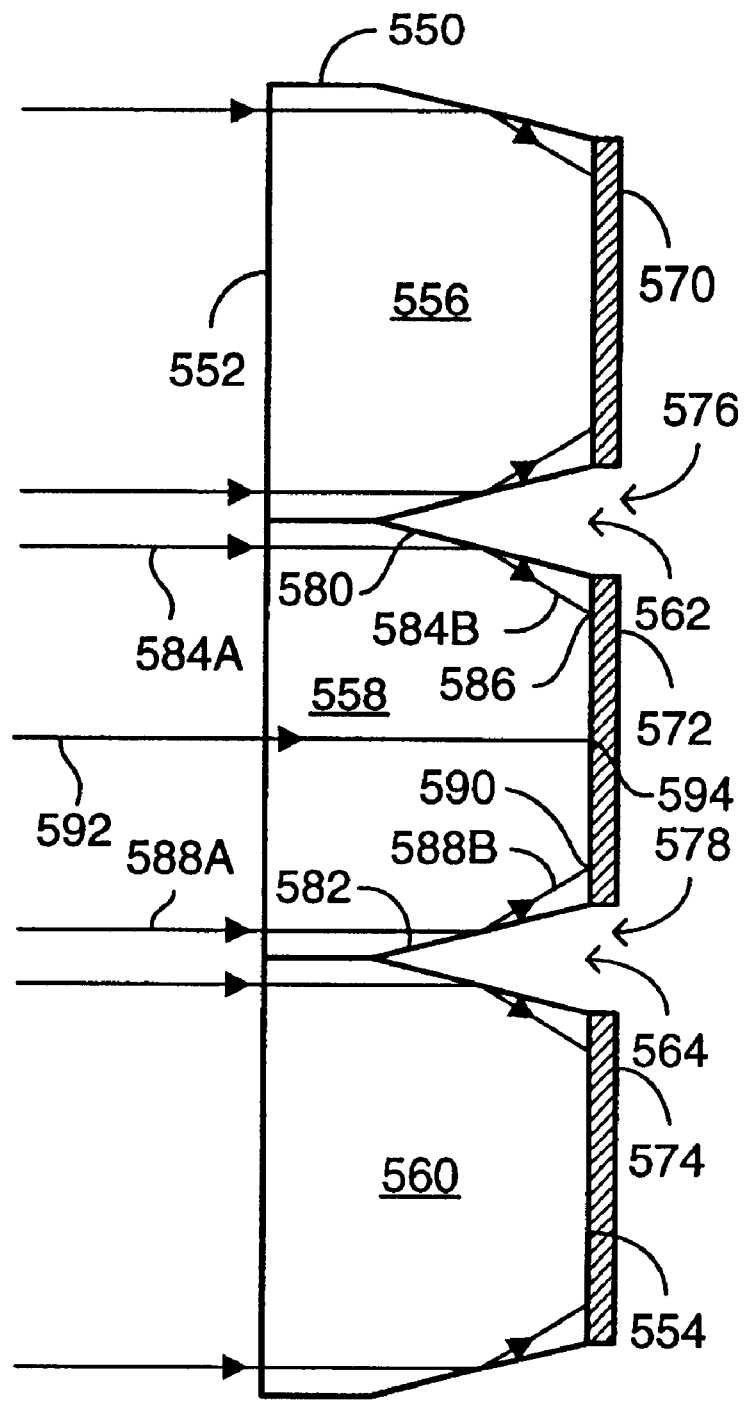
FIG. 6B is a schematic illustration of a plurality of cells, attached to the light concentrator of FIG. 6A.

Reference is now made to FIGS. 6A and 6B. FIG. 6A is a schematic illustration of a light concentrator, generally referenced 550, constructed and operative in accordance with another embodiment of the disclosed technique. FIG. 6B is a schematic illustration of a plurality of cells, attached to the light concentrator of FIG. 6A.

Light concentrator 550 is an optical structure which includes a top surface 552, a bottom surface 554, a plurality of light diverting elements 556, 558 and 560, a plurality of horizontal concentrator grooves 562 and 564 and a plurality of vertical concentrator grooves 566 and 568. Each of horizontal concentrator grooves 562 and 564, and vertical concentrator grooves 566 and 568 is "V" shaped and runs along the entire length and width of light concentrator 550. Each of light diverting elements 556, 558 and 560 is a prismatic body whose peripheral geometry is similar to the geometry of cells known in the art, such as square, rectangle, and the like. Each of light diverting elements 556, 558 and 560 is defined by the intersection of horizontal concentrator grooves 562 and 564, and vertical concentrator grooves 566 and 568.

Light concentrator 550 is made of a transparent material, such as glass, plastic, and the like, which conveys light therethrough. Light enters top surface 552 of light concentrator 550, travels through light diverting elements 556, 558 and 560, and emerges from bottom surface 554 (i.e., from the exposed surface of each of light diverting elements 556, 558 and 560).

With reference to FIG. 6B, a plurality of cells 570, 572 and 574 are attached to light diverting elements 556, 558 and 560, respectively. Generally, the cells of the cell array (not shown), are separated by a plurality of straight paths. The straight paths are mutually perpendicular and run through the entire area of the cell array. Each cell is defined by the intersection of these straight paths. The width of each cell is of the order of millimeters and the width of each of the straight paths is of the order of tenths of a millimeter. Hence, cell 570 is separated from cell 572 by a gap 576 and cell 572 is separated from cell 574, by a gap 578.

In the absence of light concentrator 550, the light strikes the usable surface of the cells, as well as the gaps between adjoining cells. The light which strikes the usable surface of a cell, heats the cell array and contributes to production of electric power by the cell. The light which falls on the gaps, heats the cell array, but does not contribute to production of electric power. Light concentrator 550 prevents the light from striking the gaps, and thus reduces the heat generated in the cell array, by that portion of light which does not contribute to power generation.

Light concentrator 550 is located on cells 570, 572 and 574, such that the usable surface of each of cells 570, 572 and 574 is in contact with light diverting elements 556, 558 and 560. Light concentrator 550 is positioned relative to cells 570, 572 and 574, such that the horizontal concentrator grooves and the vertical concentrator grooves are located on the straight paths. Thus, horizontal concentrator grooves 562 and 564 are located on gaps 576 and 578, respectively.

Horizontal concentrator grooves 562 and 564 form sloping walls 580 and 582, respectively, in light diverting element 558. A light ray 584A enters light concentrator 550 through top surface 552, in a direction substantially normal to top surface 552. Sloping wall 580 reflects light ray 584A as a light ray 584B. Light ray 584B strikes cell 572 at a point 586 located within cell 572. A light ray 588A enters light concentrator 550 through top surface 552, in a direction substantially normal to top surface 552. Sloping wall 582 reflects light ray 588A as a light ray 588B. Light ray 588B strikes cell 572 at a point 590 located within cell 572. A light ray 592 passes through light concentrator 550 without reflection and strikes cell 572 at a point 594, located within cell 572. Thus, light concentrator 550 directs light rays 584A and 588A to cell 572 and prevents light rays 584A and 588A to fall on gaps 576 and 578, respectively.

If the light which strikes top surface 552 is not uniform, then a light guide (not shown) is coupled with top surface 552, thereby rendering the incoming light more uniform. For example, if a concave mirror (not shown) directs converging beams of light toward the light guide, then the light guide makes the converging beams of light more uniform and directs the uniform light beams to top surface 552, in a direction substantially normal to top surface 552. The light guide is made of a transparent material and the cross section thereof is either circular or polygonal. Techniques for uniforming light are described in U.S. Pat. No. 6,020,553 to Yogev, which is hereby incorporated by reference. It is noted that light concentrator 550 is described in U.S. Pat. No. 6,020,553 to Yogev, which is hereby incorporated by reference.

Figure 7A:
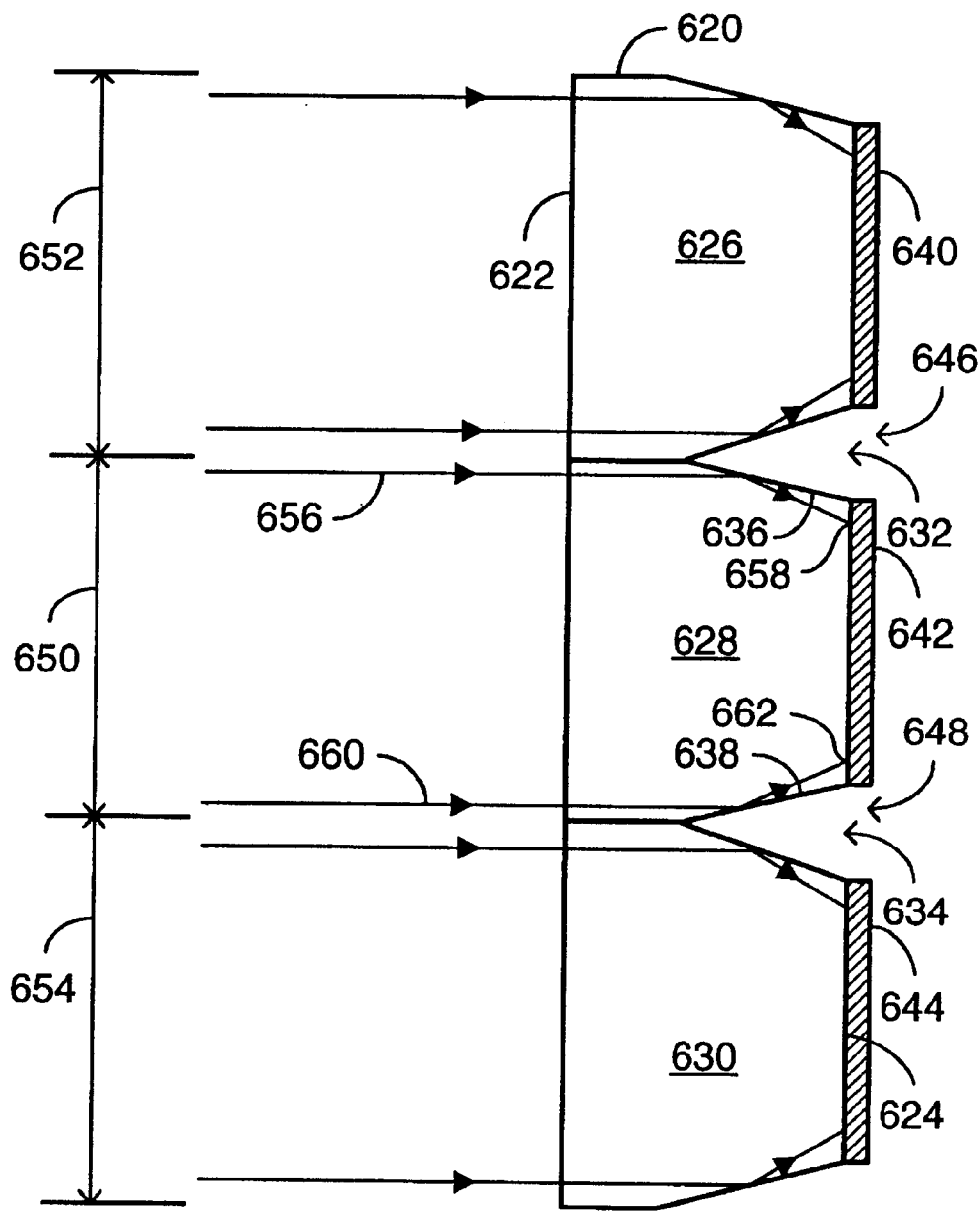
FIG. 7A is a schematic illustration of the light concentrator of FIG. 6B, wherein the flux of the light rays which reach the top surface of the light concentrator, is different in different regions.
Figure 7B:
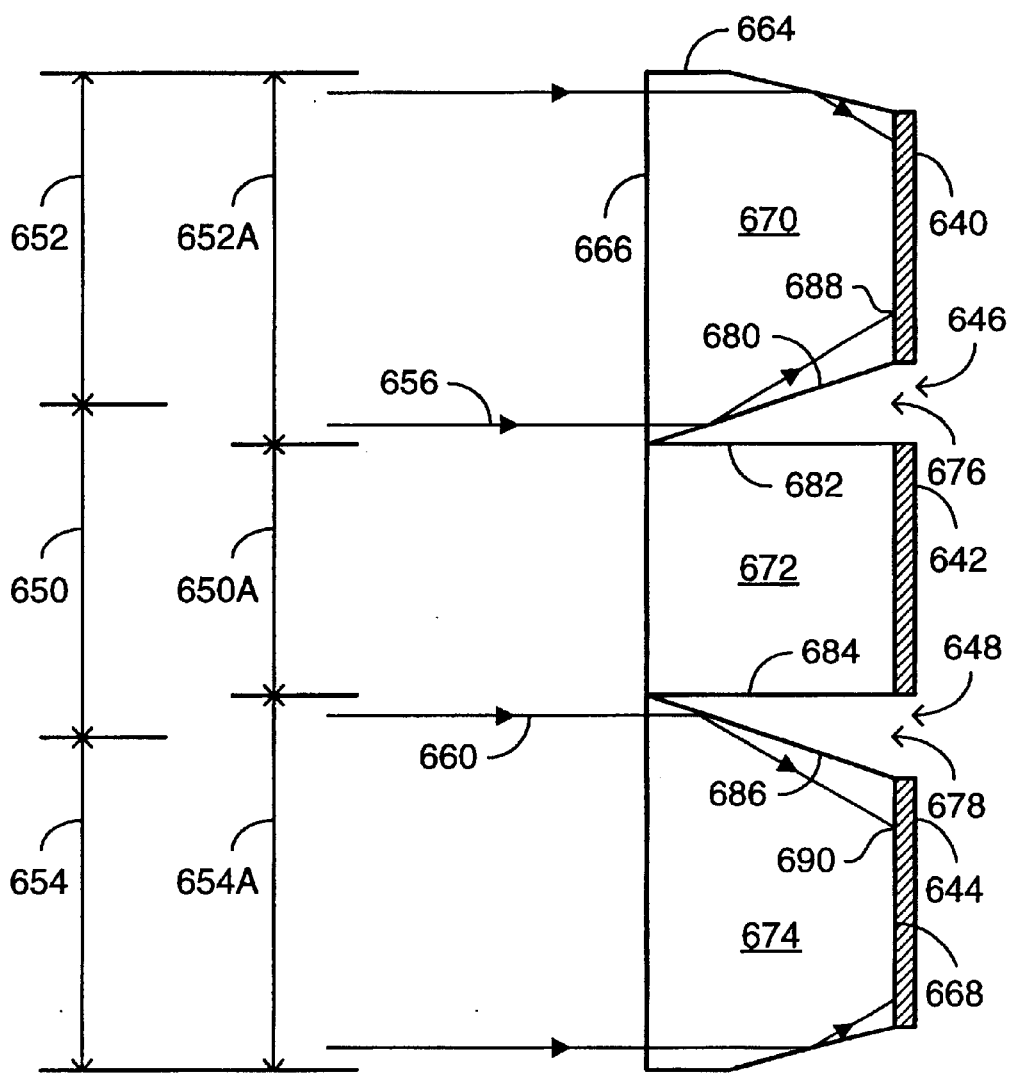
FIG. 7B is a schematic illustration of a light concentrator, constructed and operative in accordance with a further embodiment of the disclosed technique.

Reference is now made to FIGS. 7A and 7B. FIG. 7A is a schematic illustration of the light concentrator of FIG. 6B, wherein the flux of the light rays which reach the top surface of the light concentrator, is different in different regions. FIG. 7B is a schematic illustration of a light concentrator, generally referenced 664, constructed and operative in accordance with a further embodiment of the disclosed technique.

With reference to FIG. 7A, light concentrator 620 includes a top surface 622, a bottom surface 624, a plurality of light diverting elements 626, 628 and 630 and a plurality of symmetric grooves 632 and 634. Symmetric grooves 632 and 634 form sloping walls 636 and 638, respectively, in light diverting element 628.

A plurality of cells 640, 642 and 644 are attached to light diverting elements 626, 628 and 630, respectively. Cell 640 is separated from cell 642 by a gap 646. Cell 642 is separated from cell 644 by a gap 648. Light enters light concentrator 620 through top surface 622, travels through light diverting elements 626, 628 and 630 and emerges from bottom surface 624.

An optical element (not shown) directs light to top surface 622. Due to the inherent properties of the optical element, the flux of light which emerges from the optical element is not uniform and thus, different cells receive light of different flux. In the example set forth in FIG. 7A, the flux of light in a high-flux region 650 is greater than the flux of light in low-flux regions 652 and 654. Light from high-flux region 650 enters light diverting element 628. Light from low-flux regions 652 and 654 enters light diverting elements 626 and 630, respectively.

A light ray 656 which originates from high-flux region 650, is reflected by sloping wall 636 and strikes cell 642 at a point 658. A light ray 660 which originates from high-flux region 650, is reflected by sloping wall 638 and strikes cell 642 at a point 662. Similarly, light diverting elements 626 and 630 direct light from low-flux regions 652 and 654, respectively, to cells 640 and 644, respectively. Thus, the flux of light which reaches cell 642 is greater than the flux of light which reaches cells 640 and 644.

With reference to FIG. 7B, light concentrator 664 includes a top surface 666, a bottom surface 668, a plurality of light diverting elements 670, 672 and 674 and a plurality of asymmetric grooves 676 and 678. Asymmetric groove 676 forms a sloping wall 680 in light diverting element 670 and a normal wall 682 in light diverting element 672. Asymmetric groove 678 forms a normal wall 684 in light diverting element 672 and a sloping wall 686 in light diverting element 674. Normal walls 682 and 684 are perpendicular to top surface 666.

Light ray 656 is reflected by sloping wall 680 and strikes cell 640 at a point 688. Light ray 660 is reflected by sloping wall 686 and strikes cell 644 at a point 690. Thus, light diverting elements 670 and 674 direct a portion of the light from high-flux region 650, which would otherwise reach cell 642, to cells 640 and 644, respectively. Similarly, cell 642 receives a smaller portion of the light from high-flux region 650. In this manner, light concentrator 664 distributes the light among the cells, substantially evenly, such that all cells receive light of substantially the same flux.

It is noted that each of the light diverting elements 670, 672 and 674 receives light from regions 652A, 650A and 654A, respectively. Denoting the flux in each of the regions 652A, 650A and 654A, by $\phi_2$, $\phi_0$ and $\phi_4$, respectively, the area of each of the regions 652A, 650A and 654A, by $S_2$, $S_0$ and $S_4$, respectively, and the intensity of light by I, $\phi_0 > \phi_2$ $\phi_0 > \phi_4$ $S_0 < S_2$ $S_0 < S_4$ $I_0 = \phi_0 S_0$ $I_2 = \phi_2 S_2$ $I_4 = \phi_4 S_4$ and hence, $I_0 = I_2 = I_4$ Thus, light concentrator 664 concentrates light of equal intensity on cells 640, 642 and 644. It is however noted that any other arrangement is applicable using the disclosed light shifting technique, so as to produce other illumination ratios between adjacent cells.

Figure 8A:
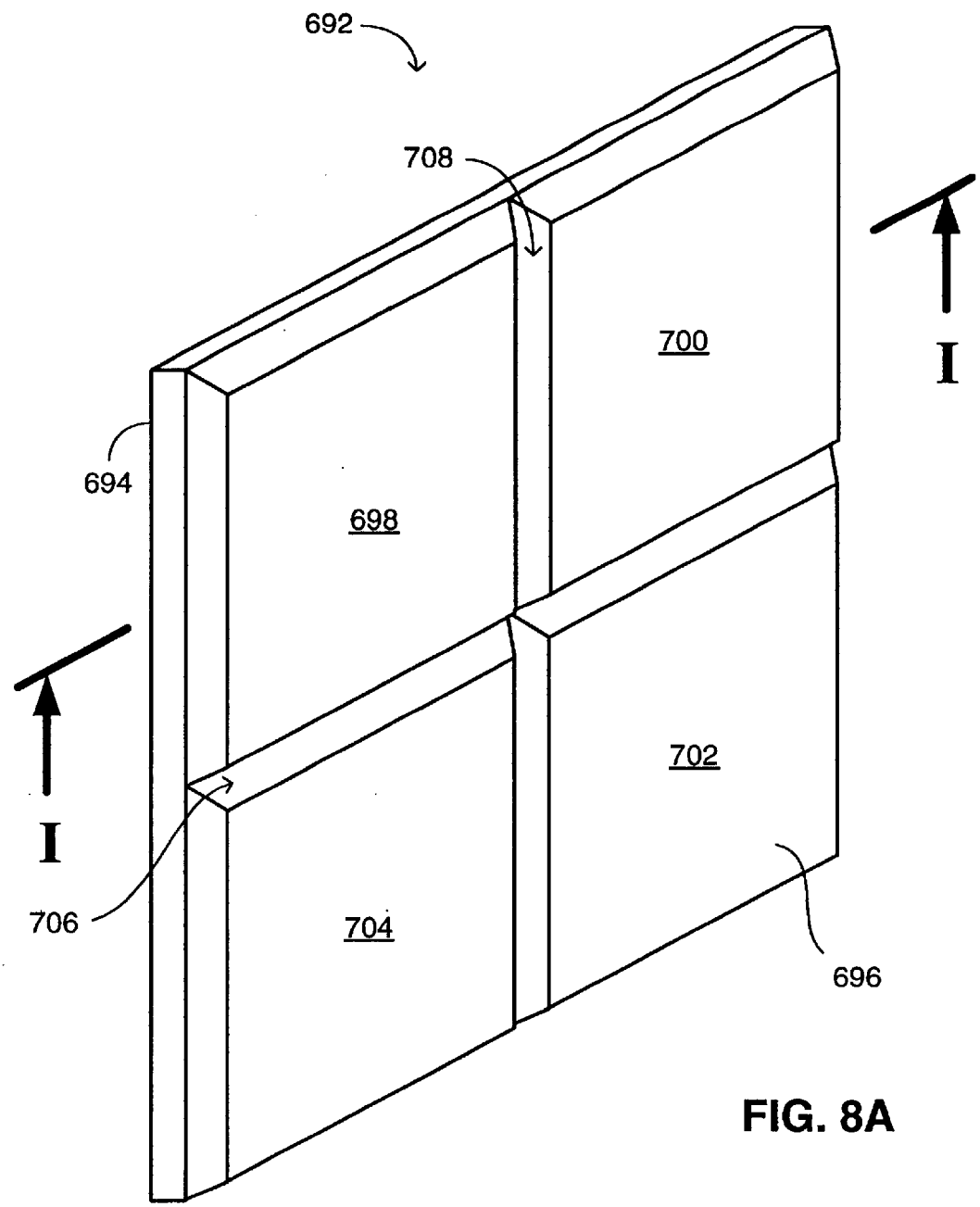
FIG. 8A is a schematic illustration of a light concentrator, constructed and operative in accordance with another embodiment of the disclosed technique.
Figure 8B:
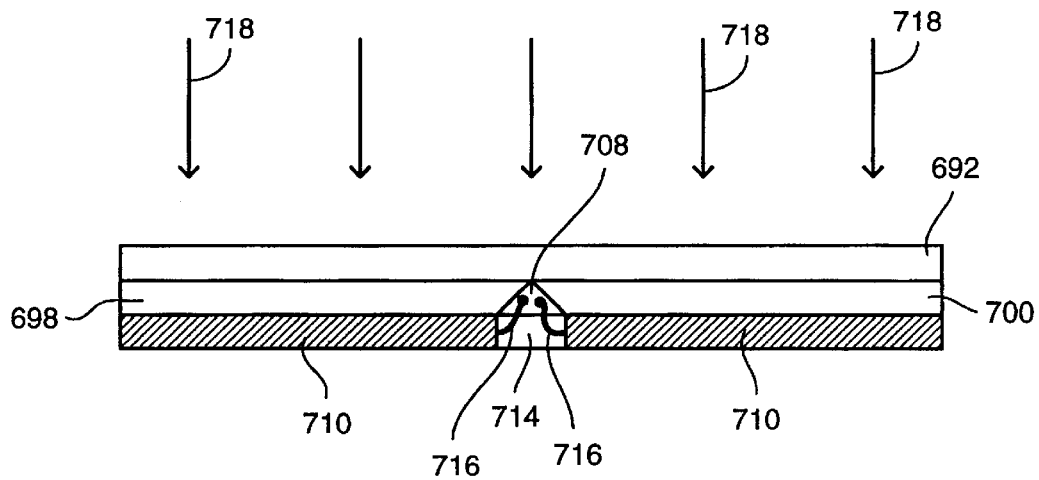
FIG. 8B is a schematic illustration of section I—I of the light concentrator of FIG. 8A assembled on a plurality of groups of cells, constructed and operative in accordance with a further embodiment of the disclosed technique.
Figure 8C:
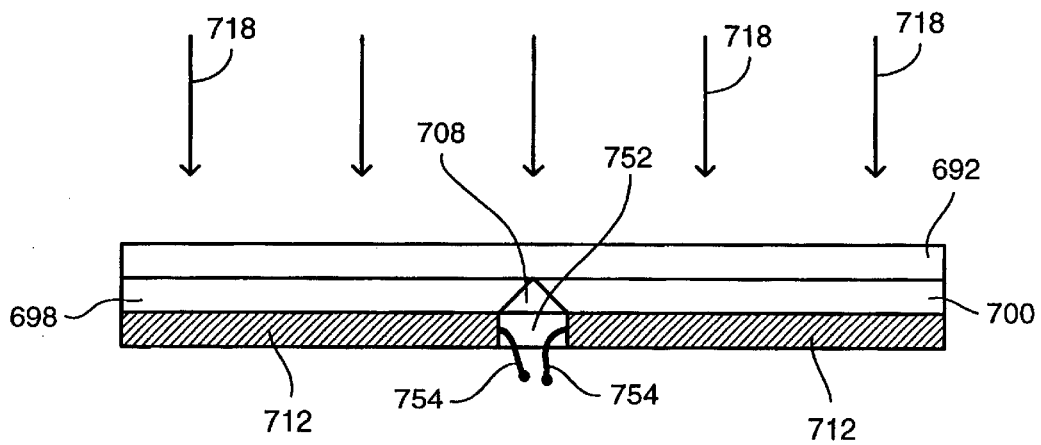
FIG. 8C is a schematic illustration of section I—I of the light concentrator of FIG. 8A, assembled on a plurality of groups of cells, constructed and operative in accordance with another embodiment of the disclosed technique.

Reference is now made to FIGS. 8A, 8B and 8C. FIG. 8A is a schematic illustration of a light concentrator, generally referenced 692, constructed and operative in accordance with another embodiment of the disclosed technique. FIG. 8B is a schematic illustration of section I—I of the light concentrator of FIG. 8A assembled on a plurality of groups of cells, generally referenced 710, constructed and operative in accordance with a further embodiment of the disclosed technique. FIG. 8C is a schematic illustration of section I—I of the light concentrator of FIG. 8A, assembled on a plurality of groups of cells, generally referenced 712, constructed and operative in accordance with another embodiment of the disclosed technique.

With reference to FIG. 8A, light concentrator 692 includes a top surface 694, a bottom surface 696, light diverting elements 698, 700, 702 and 704, a horizontal concentrator groove 706 and vertical concentrator groove 708. The material, construction and operation of light concentrator 692 are similar to those of light concentrator 550, as described herein above in connection with FIG. 6A.

With reference to FIG. 8B, vertical concentrator groove 708 is aligned with a vertical cell groove 714 and horizontal concentrator groove 706 is aligned with a horizontal cell groove (not shown). A plurality of electrical wires 716 couple respective groups of cells 710, to respective power accumulators, such as batteries, capacitors, and the like (not shown), or to a load (not shown). Electrical wires 716 exit the group of cells 710 through vertical cell groove 714 between the group of cells 710 and pass above the group of cells 710, within vertical concentrator groove 708. Electrical wires 716 exit the group of cells 710, also through the horizontal cell groove between the group of cells 710 and pass above the group of cells 710, within horizontal concentrator groove 706 (not shown in FIG. 8B). It is noted that light concentrator 692 prevents light rays 718 to reach horizontal concentrator groove 706, vertical concentrator groove 708, the horizontal cell groove and vertical cell groove 714 and thus, electrical wires 716 are not heated as much, in case light concentrator 692 was not assembled on the group of cells 710.

With reference to FIG. 8C, vertical concentrator groove 708 is aligned with a vertical cell groove 752 and horizontal concentrator groove 706 is aligned with a horizontal cell groove (not shown). A plurality of electrical wires 754 couple the group of cells 712 to respective power accumulators, as described herein above in connection with FIG. 8B. Electrical wires 754 exit the group of cells 712 through vertical cell groove 752 and through the horizontal cell groove and pass through the bottom portion of the group of cells 712, to be coupled with a load or to a power accumulator. Again, as in the case of the embodiment of FIG. 8B, vertical concentrator groove 708 prevents light rays 718 to reach electrical wires 754 and thus, electrical wires 754 are not overheated.

Figure 9A:
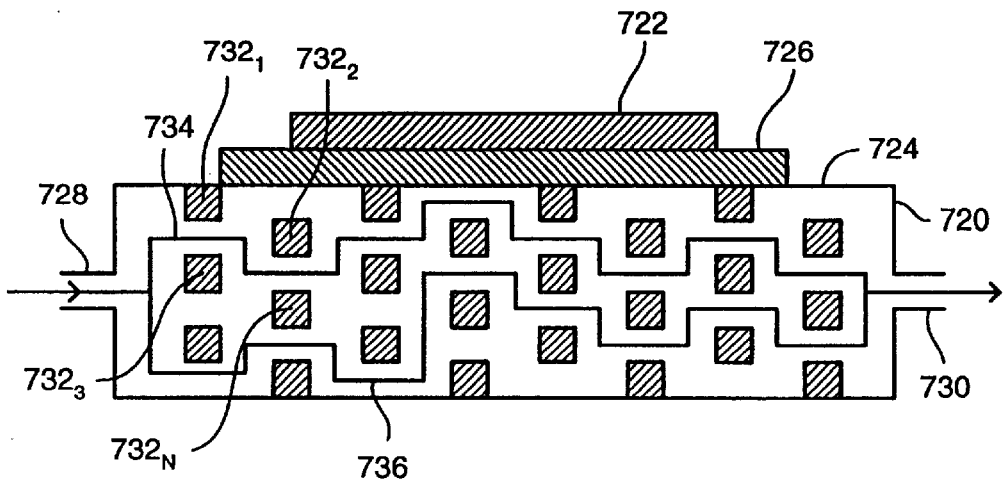
FIG. 9A is a schematic illustration of a cell attached to a cooling compartment, constructed and operative in accordance with a further embodiment of the disclosed technique.
Figure 9B:
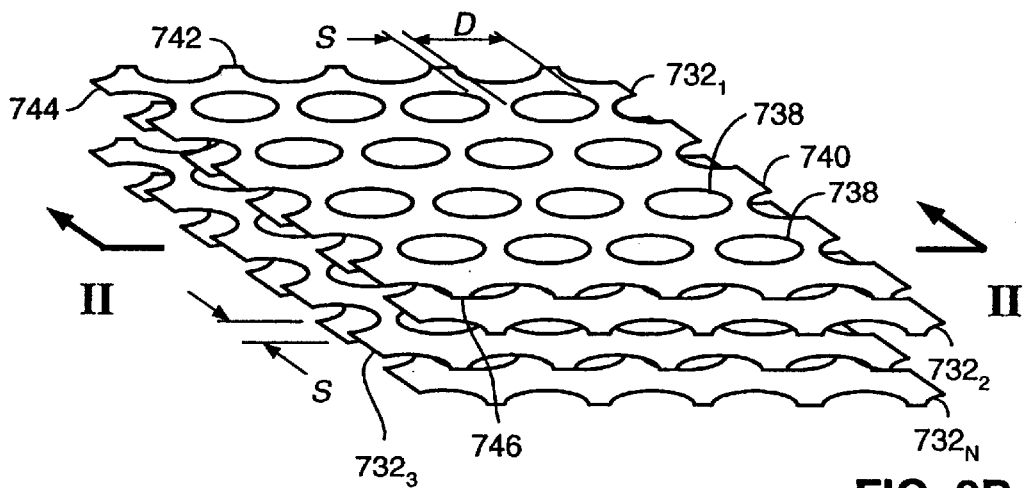
FIG. 9B is a perspective view of the perforated layers of the cooling compartment of FIG. 9A.
Figure 9C:
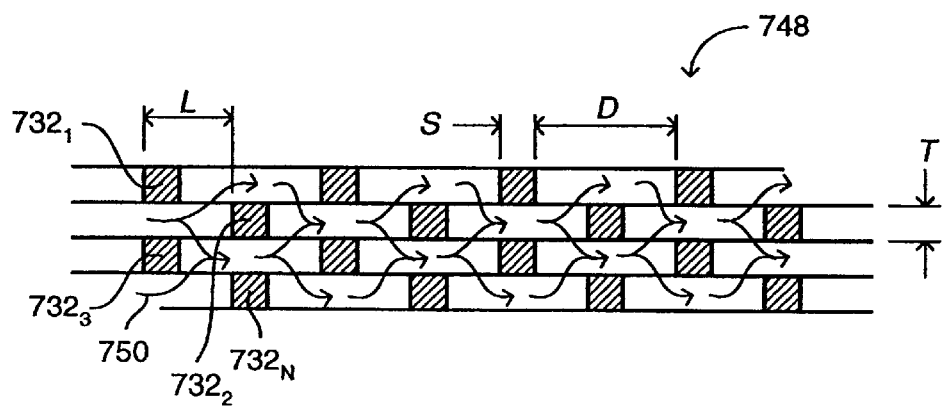
FIG. 9C is a schematic illustration of section II—II of perforated layers of FIG. 9B.

Reference is now made to FIGS. 9A, 9B and 9C. FIG. 9A is a schematic illustration of a cell attached to a cooling compartment, generally referenced 720, constructed and operative in accordance with a further embodiment of the disclosed technique. FIG. 9B is a perspective view of the perforated layers of the cooling compartment of FIG. 9A. FIG. 9C is a schematic illustration of section II—II of perforated layers of FIG. 9B.

With reference to FIG. 9A, a cell array 722 is coupled with a surface 724 of cooling compartment 720, via an insulator 726. Insulator 726 is a material having a substantially high dielectric strength and high heat transfer coefficient, such as ceramic Alumina ($Al_2O_3$), Aluminum Nitride, and the like. Thus, insulator 726 provides electrical insulation between cell array 722 and cooling compartment 720, while providing heat transfer between cell array 722 and cooling compartment 720.

Cooling compartment 720 includes an inlet 728, an outlet 730 and a plurality of perforated layers $732_1$, $732_2$, $732_3$ and $732_N$. The heat generated by cell array 722, transfers to perforated layers $732_1$, $732_2$, $732_3$ and $732_N$ via insulator 726. A cooling fluid such as water, an organic fluid (e.g., a hydrocarbon), and the like, enters cooling compartment 720 through inlet 728. Perforated layers $732_1$, $732_2$, $732_3$ and $732_N$ are arranged in a plurality of layers, to provide a plurality of fluid paths 734 and 736. The cooling fluid flows in fluid paths 734 and 736, absorbs the heat which is generated by cell array 722 and leaves cooling compartment 720 through outlet 730. In this manner, cooling compartment 720 cools the cell array 722, thereby enabling operation of cell array 722 with greater light flux and thus, increasing the output power of cell array 722.

With reference to FIG. 9B, the construction and arrangement of perforated layers $732_1$, $732_2$, $732_3$ and $732_N$ is described herein below. The boundary of each of perforated layers $732_1$, $732_2$, $732_3$ and $732_N$ is defined by a square, rectangle, circle, ellipse, closed curvature, and the like. Each of perforated layers $732_1$, $732_2$, $732_3$ and $732_N$ is made of a material having a substantially high coefficient of heat transfer, such as copper, copper alloy, aluminum, aluminum alloy, and the like.

Each of perforated layers $732_1$, $732_2$, $732_3$ and $732_N$ includes a plurality of perforations 738. The boundary of each of the perforated layers $732_1$, $732_2$, $732_3$ and $732_N$ is designated by edges 740, 742, 744 and 746. The geometry and dimensions of perforations 738 are substantially identical in all of the perforated layers $732_1$, $732_2$, $732_3$ and $732_N$. Perforations 738 illustrated in FIG. 9B have a circular geometry. The diameter of each of the perforations 738 is designated by D and the distance between every two adjoining perforations 738 is designated by S, such that S<D. Each of the edges 740, 742, 744 and 746 is perforated by perforations 738. It is noted that perforations 738 can have a geometry other than circular, such as a polygon, a closed curvature, and the like.

With reference to FIG. 9C, the thickness of each of the perforated layers $732_1$, $732_2$, $732_3$ and $732_N$ is designated by T, such that T<<D. The thickness T is generally of the order of tenths of a millimeter. Perforated layers $732_1$, $732_2$, $732_3$ and $732_N$ are arranged in a stack 748, such that every second of the perforated layers $732_1$, $732_2$, $732_{3\ and\ 732N}$ is offset by a distance L, wherein $$L > S \qquad (25)$$

$$L \neq D \qquad (26)$$

By stacking perforated layers $732_1$, $732_2$, $732_3$ and $732_N$ in this manner, a plurality of fluid paths 750 are created between all of the perforated layers $732_1$, $732_2$, $732_3$ and $732_N$. It is noted that stack 748 provides a substantially large contact area with the cooling fluid, thereby increasing the capacity of the cooling fluid to absorb the heat from stack 748. According to another aspect of the disclosed technique, various designs are employed in order to distribute the flux of light on the cell array in a substantially uniform manner. Furthermore, other arrangements are employed to direct substantially more light toward the cell array, thereby reducing wasted radiation and increasing the operating efficiency of the cell array.

For example, a concave mirror constructed of a plurality of reflective plates directs the solar radiation toward the cell array, such that each reflective plate reflects an image of the sun, on a substantially small region of the cell array. Furthermore, a plurality of flat reflective plates surrounds the periphery of the cell array, such that each flat reflective plate directs the light which falls outside the cell array, back toward the cell array.

Figure 10B:
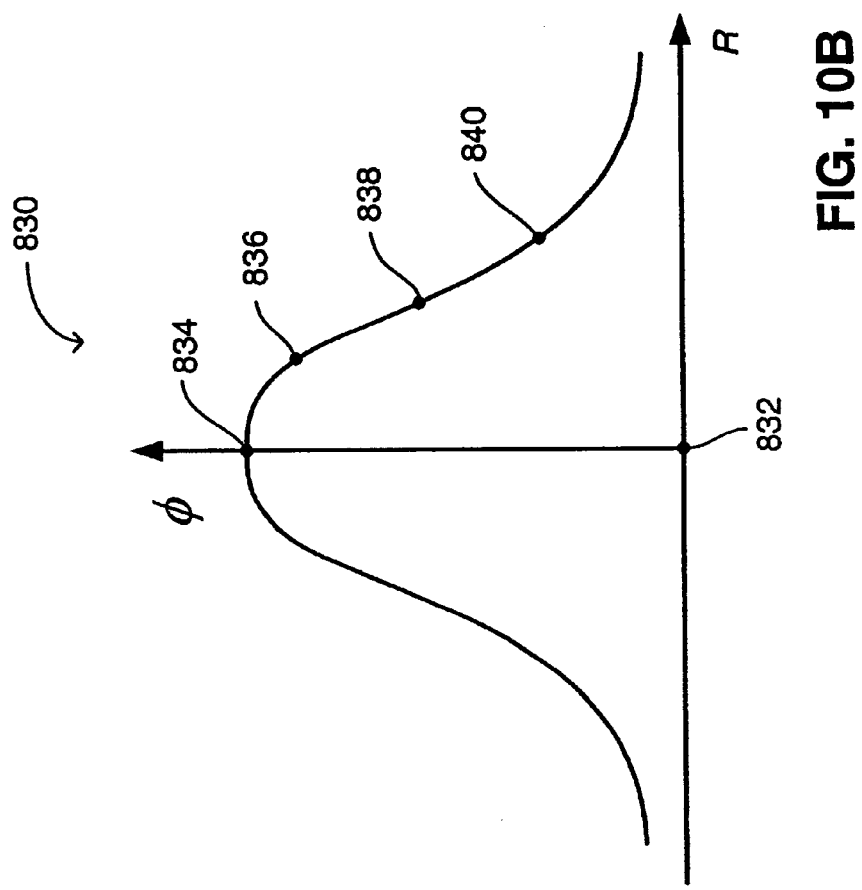
FIG. 10B is a graphical illustration of distribution of the flux of the image of the sun on the cell array of FIG. 10A.
Figure 10A:
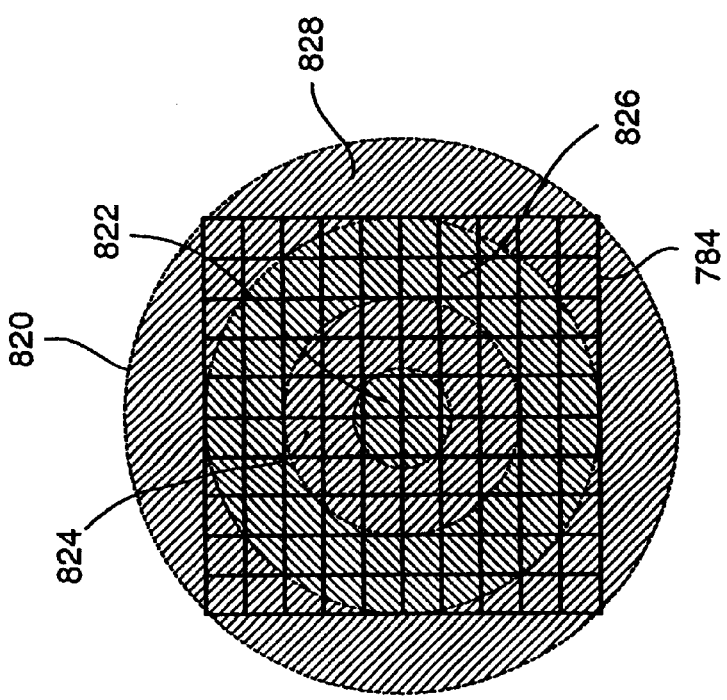
FIG. 10A is a schematic illustration of an image of the sun reflected by a mirror on a cell array.
Figure 10C:
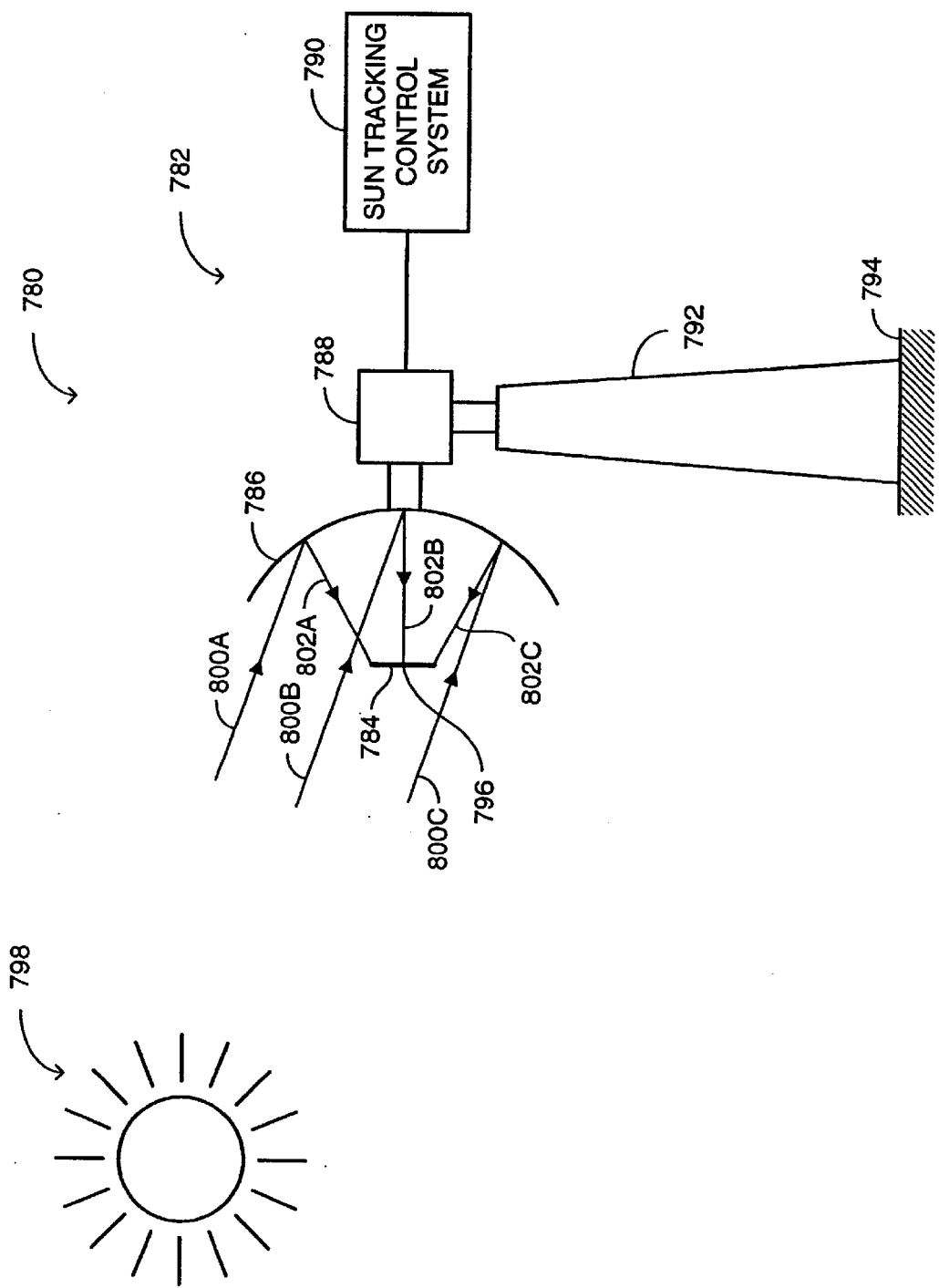
FIG. 10C is a schematic illustration of a solar energy system, constructed and operative in accordance with another embodiment of the disclosed technique.
Figure 10D:
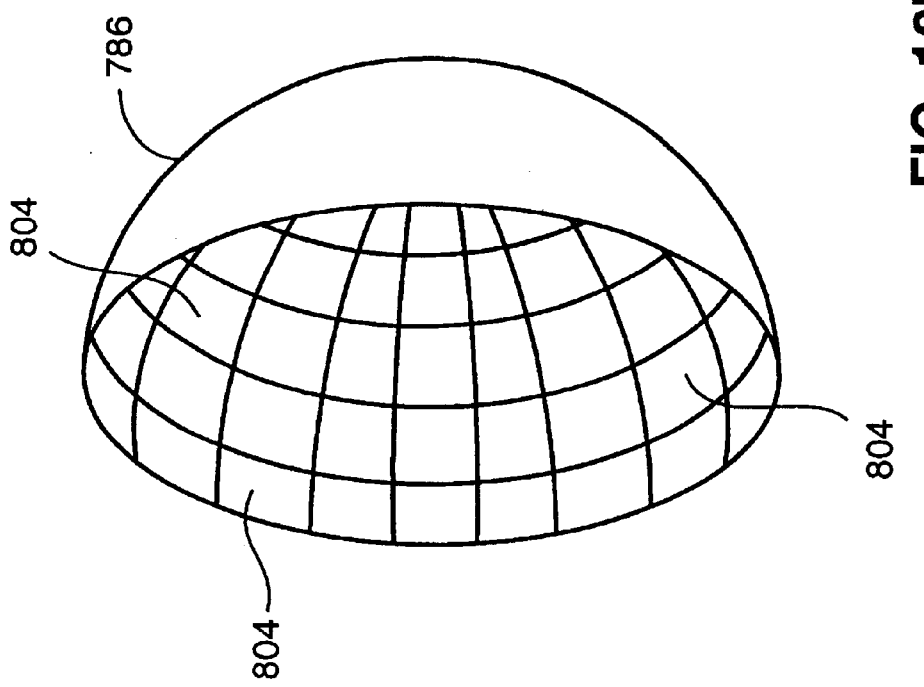
FIG. 10D is a schematic illustration of the mirror of the solar energy system of FIG. 10C.
Figure 10F:
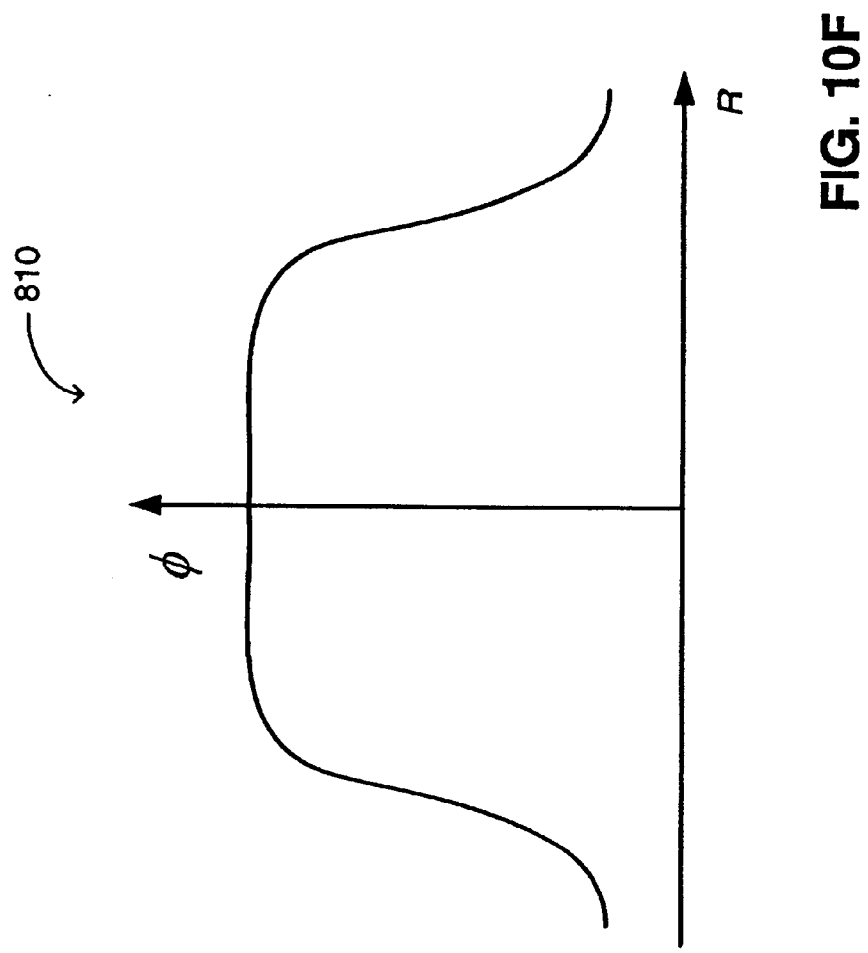
FIG. 10F is a graphical illustration of the distribution of the flux of light which reaches the cell array of FIG. 10E.
Figure 10E:
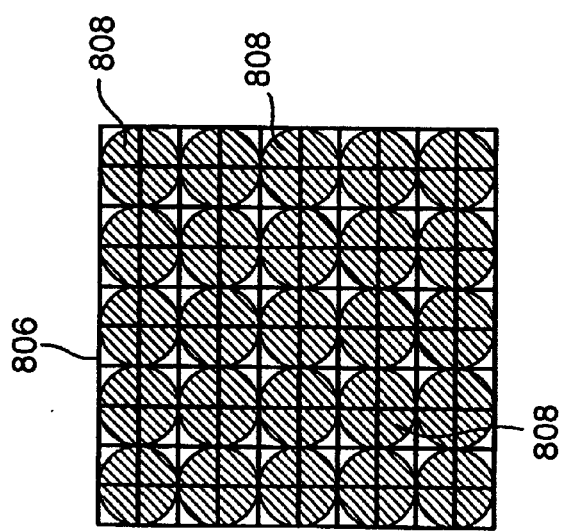
FIG. 10E is a schematic illustration of distribution of light on a cell array, as reflected by the reflective plates of the mirror of FIG. 10D.
Figure 10G:
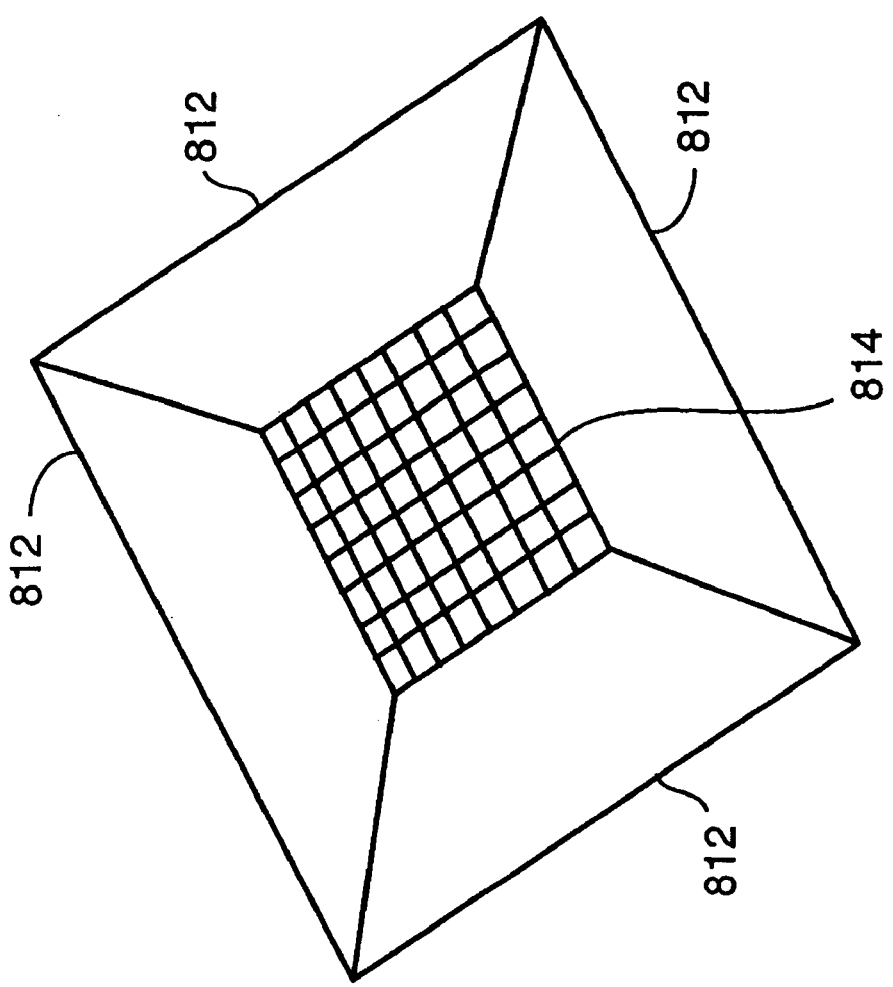
FIG. 10G is a schematic illustration of a plurality of flat reflective plates, constructed and operative in accordance with a further embodiment of the disclosed technique.

Reference is now made to FIGS. 10A, 10B, 10C, 10D, 10E, 10F and 10G. FIG. 10A is a schematic illustration of an image of the sun reflected by a mirror, on a cell array, generally referenced 784. FIG. 10B is a graphical illustration, generally referenced 830, of distribution of the flux of the image of the sun on the cell array of FIG. 10A. FIG. 10C is a schematic illustration of a solar energy system, generally referenced 780, constructed and operative in accordance with another embodiment of the disclosed technique. FIG. 10D is a schematic illustration of the mirror of the solar energy system of FIG. 10C. FIG. 10E is a schematic illustration of distribution of light on a cell array, generally referenced 806, as reflected by the reflective plates of the mirror of FIG. 10D. FIG. 10F is a graphical illustration, generally referenced 810, of the distribution of the flux of light which reaches the cell array of FIG. 10E. FIG. 10G is a schematic illustration of a plurality of flat reflective plates, generally referenced 812, constructed and operative in accordance with a further embodiment of the disclosed technique.

With reference to FIG. 10A, a mirror (not shown) reflects an image 820 of the sun on cell array 784. Image 820 overlaps the boundaries of cell array 784. Image 820 includes an inner circle 822 and a plurality of annular rings 824, 826 and 828.

With reference to FIG. 10B, the abscissa of graph 830 is the radius R of image 820 and the ordinate of graph 830 is the flux φ of image 820. A point 832 on graph 830 designates the center of image 820 (i.e., where the radius thereof is zero). A point 834 on graph 830 represents a flux $\phi_1$ of inner circle 822. Points 836, 838 and 840 represent fluxes $\phi_2$, $\phi_3$ and $\phi_4$ of annular rings 824, 826 and 828, respectively, where, $\phi_2 < \phi_1$ $\phi_3 < \phi_2$ and $\phi_4 < \phi_3$ The flux of light reaching those cells of cell array 784, which are located in inner circle 822, is substantially equal to $\phi_1$. The flux of light reaching those cells of cell array 784, which are located in annular ring 824, is substantially equal to $\phi_2$. The flux of light reaching those cells of cell array 784, which are located in annular ring 826, is substantially equal to $\phi_3$ and the flux of light reaching those cells of cell array 784, which are located in annular ring 828, is substantially equal to $\phi_4$. Since the flux of light is maximal at the center of cell array 784 and exponentially falls as the radius increases, the distribution of flux on cell array 784 is substantially non-uniform.

With reference to FIG. 10C, solar energy system 780 includes a heliostat 782, and a cell array 784. Heliostat 782 includes a mirror 786, a servo mechanism 788, a sun tracking control system 790 and a pillar 792.

Servo mechanism 788 includes mechanical and electronic components (not shown), such as motors, gears, shafts, bearings, and the like. Sun tracking control system 790 is a control system which controls the operation of servo mechanism 788. Servo mechanism 788 is coupled with mirror 786 and to pillar 792. Pillar 792 supports servo mechanism 788 and mirror 786 on the top thereof. Pillar 792 is mounted on a surface 794. Sun tracking control system 790 is coupled with servo mechanism 788. Cell array 784 is located at a focal point 796 of mirror 786. Mirror 786 reflects light beams 800A, 800B and 800C as light beams 802A, 802B and 802C on cell array 784.

Sun tracking control system 790 is an open loop control system which controls the operation of servo mechanism 788, such that mirror 786 points toward the sun 798, at all times. In this case, sun tracking control system 790 includes information respective of the daily predicted positions of the sun 798 relative to the Earth, such as the latitude, hour angle, declination of the sun, and the like. Servo mechanism 788 constantly moves mirror 786 according to the signals received from sun tracking system 790 and thus, mirror 786 constantly tracks the sun 798.

However, sun tracking control system 790 receives no feedback respective of the current orientation of mirror 786 with respect to the sun 798. Therefore, the couplings between servo mechanism 788 and mirror 786, servo mechanism 788 and pillar 792, and pillar 792 and surface 794, have to be substantially rigid. Otherwise mirror 786 does not point toward the true position of the sun 798 relative to the Earth, and the flux of light beams 802A, 802B and 802C which strike the surface of cell array 784, is not maximal.

Alternatively, sun tracking control system 790 is a closed loop control system. In this case, sun tracking control system 790 includes an optical sensor (not shown) located adjacent to mirror 786, where the optical sensor detects the flux of light beams 800A, 800B and 800C, which strike the surface of mirror 786. According to a feedback signal which sun tracking control system 790 receives from the optical sensor, sun tracking control system 790 operates servo mechanism 788 to move mirror 786, such that the flux of light beams 802A, 802B and 802C striking cell array 784, is maximal. Thus, sun tracking control system 790 directs servo mechanism 788 to move mirror 786, such that mirror 786 tracks the sun 798. In this case, the couplings between servo mechanism 788 and mirror 786, servo mechanism 788 and pillar 792, and pillar 792 and surface 794, need not be as rigid as in the case of an open loop control system.

With reference to FIGS. 10D, 10E and 10F, mirror 786 is a concave mirror which includes a plurality of reflective plates 804. Each of reflective plates 804 is mounted on the concavity of mirror 786, in such an orientation, that each reflective plate 804 directs an image 808 of the sun, on a respective region of cell array 806. Thus, the distribution of flux of light on cell array 806 is substantially more uniform than that on cell array 784 (FIG. 10A). This distribution is illustrated by graph 810 (FIG. 10F), which is substantially more flat than graph 830 (FIG. 10B). Alternatively, different groups of reflective plates each direct an image of the sun, on a different respective region of cell array, thereby increasing the uniformity of radiation on the cell array.

With further reference to FIG. 10A, the cells which are entirely or partially located in inner circle 822 are ideally coupled together in series. However, due to physical constraints not all of the cells in a selected iso-flux region can be coupled together, and in addition, an iso-flux region which is divided to groups, each group including a predetermined number of cells, may include extra cells which are less than that predetermined number. Such cells may be coupled with other cells which are located in other regions of cell array 784.

Likewise, the cells which are located in annular ring 824 are ideally coupled together in series. The cells which are located in annular ring 826 are ideally coupled together in series and the cells which are located in annular ring 828 are ideally coupled together in series. The serially coupled cells associated with inner circle 822 and the serially coupled cells associated with annular rings 824, 826 and 828, are coupled in parallel, to a load (not shown). Thus, the cells of cell array 784 are divided to a plurality of groups according to the value of the flux which each of these cells receives, and the cells in each group are coupled together in series. These groups are then coupled in parallel across a load.

A current $i_1$ flows out of the group of cells which are located in inner circle 822, and currents $i_2$ and $i_3$ flow out of the group of cells which are located in annular rings 824 and 826, respectively. Currents $i_1$, $i_2$ and $i_3$ are proportional to the flux of light in inner circle 822 and in annular rings 824 and 826, respectively. A processor located in a sun tracking control system, such as the sun tracking control system of FIG. 10C, constantly compares the absolute values of currents $i_1$, $i_2$ and $i_3$ at a given moment, with a predetermined value scheme (e.g., values of the respective currents at a previous point in time, predetermined value ratios, and the like). In the present example, the value scheme is a maximum for the sum of $i_1$, $i_2$ and $i_3$ (i.e., $MAX(i_1+i_2+i_3)$). The sun tracking control system adjusts the orientation of a mirror, such as mirror 786 of FIG. 10C, according to the outcome of this comparison, such that the sum of the currents $i_1$, $i_2$ and $i_3$ (i.e., the respective flux of light) is maximal at all times.

According to this aspect of the disclosed technique, the sun tracking control system is a closed loop control system, which controls the operation of the servo mechanism according to the information provided by different groups of cells. The sun tracking control system adjusts the orientation of the mirror according to the relative or absolute current levels of the group of cells (which indicate the relative or absolute flux of light, respectively), so that the flux of light which reaches the cell array is maximal.

Alternatively, the processor compares the values of the currents at the output of a plurality of groups of cells, relative to a selected group of cells and the sun tracking control system adjusts the orientation of the mirror, according to the outcome of this comparison. It is noted that in either case, no light sensors are required to measure the flux of light which reaches each group of cells. Hence, the error in the closed loop control system is minimal and there is no need to calibrate the sun tracking control system with the reading of the light sensors.

It is noted that the sun tracking control system may operate according to special tracking methods, operative to address special situations which require deviation from a direct link between the detected flux and the position of the mirrors. Such a special situation occurs in the presence of traveling clouds, which temporarily blocks the sun light from reaching the mirrors and subsequently, the cell arrays. In such a case, the mirrors should not be moved from their present location, since the relative location of the sun has not changed. Such a tracking method weighs factors such as the change of flux in time, the differentiation of the flux and the flux changes, over a field of detectors, and the like. When detecting that the flux has changed too rapidly, over a given period of time, which may characterize a traveling cloud (i.e., minutes), the sun tracking control system shall not adjust the orientation of the mirrors.

However, if this change in flux continues over a substantially long time, for example of the order of tens of minutes, then the sun tracking control system may adjust the orientation of the mirrors, such that light of a greater flux will strike that particular cell. A long term change in flux can occur, for example, because of change in the relative positions of the Earth and the sun, errors in reorienting the mirror caused by mechanical backlash in the servo mechanism, and the like.

With reference to FIG. 10G, each of the flat reflective plates 812 is oriented at an angle greater than 90 degrees relative to the surface of a cell array 814. A mirror, such as mirror 786 (FIG. 10D) directs light toward flat reflective plates 812. Flat reflective plates 812 direct the portion of light which falls outside of cell array 814, back toward cell array 814.

Figure 11:
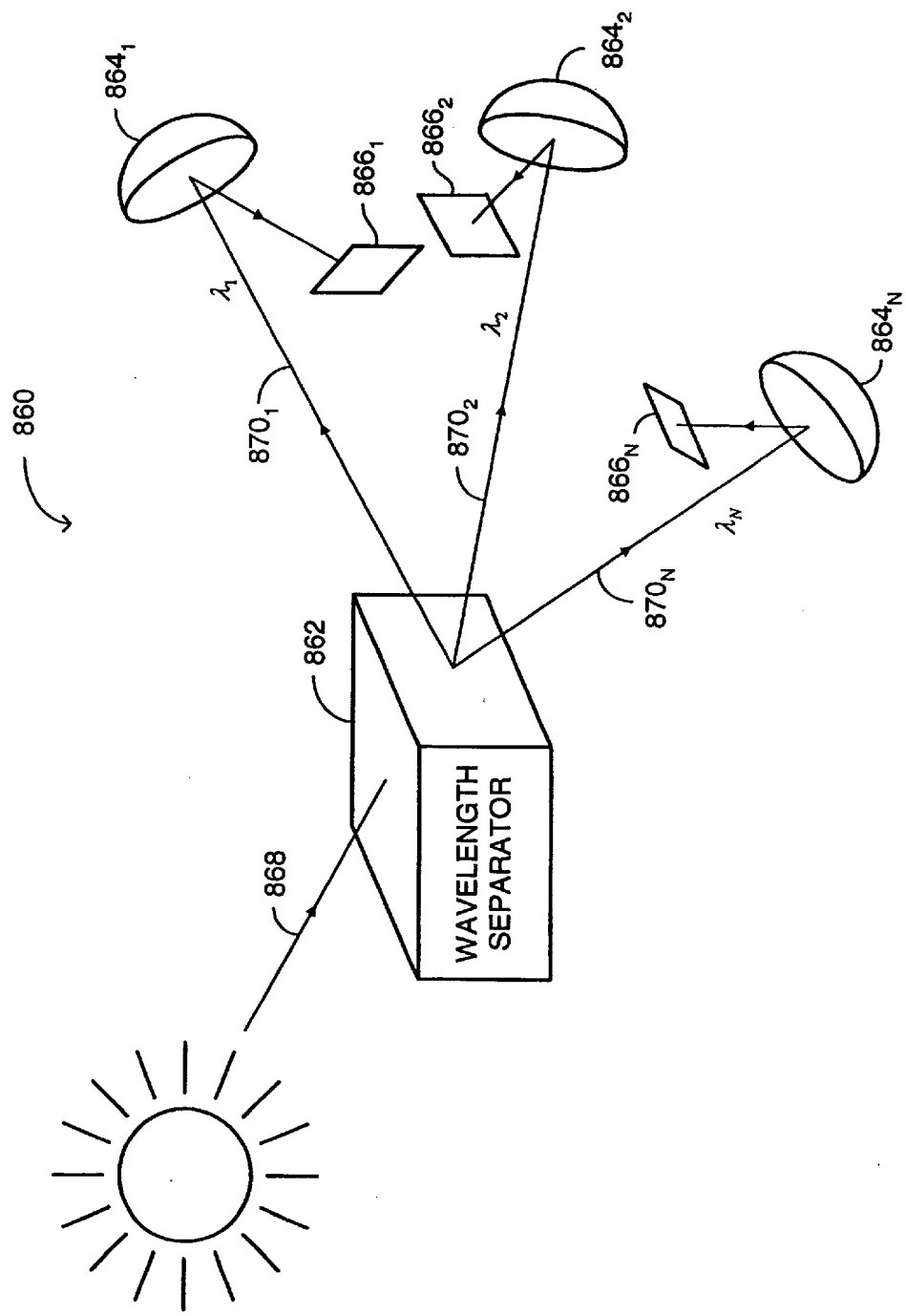
FIG. 11 is a schematic illustration of a solar energy system, constructed and operative in accordance with a further embodiment of the disclosed technique.

Reference is now made to FIG. 11, which is a schematic illustration of a solar energy system, generally referenced 860, constructed and operative in accordance with a further embodiment of the disclosed technique. System 860 includes a wavelength separator 862, a plurality of mirrors $864_1$, $864_2$ and $864_N$, and a plurality of cell arrays $866_1$, $866_2$ and $866_N$.

Wavelength separator 862 is a device which receives a multiwavelength light and separates this multiwavelength light to different light beams at different wavelengths. Wavelength separator 862 can be in form of prism, splitter, filter, and the like. Each of cell arrays $866_1$, $866_2$ and $866_N$ generates a current in response to a light beam at a predetermined wavelength. For this purpose, each of cell arrays $866_1$, $866_2$ and $866_N$ is constructed of a semiconducting material whose energy-gap substantially matches one of these predetermined wavelengths. Thus, each of cell arrays $866_1$, $866_2$ and $866_N$ generates a current in response to light beam at one of these predetermined wavelengths. The voltage across a cell arrays depends on the wavelength of the light beam which strikes the cell array.

Wavelength separator 862 receives a multiwavelength light beam 868 at a plurality of wavelengths $\lambda_1$, $\lambda_2$ and $\lambda_N$. Wavelength separator 862 separates multiwavelength light beam 868 to a plurality of light beams $870_1$, $870_2$ and $870_N$ at wavelengths $\lambda_1$, $\lambda_2$ and $\lambda_N$, respectively, and directs light beams $870_1$, $870_2$ and $870_N$ toward mirrors $864_1$, $864_2$ and $864_N$, respectively. Mirrors $864_1$, $864_2$ and $864_N$, direct light beams $870_1$, $870_2$ and $870_N$, respectively, at cell arrays $866_1$, $866_2$ and $866_N$, respectively.

According to another aspect of the disclosed technique, the mirror can separate the solar light into different wavelengths. According to this aspect, the mirror is semi-transparent and separates the solar light by reflecting light at one set of wavelengths to one or more cell arrays and admitting light at other sets of wavelengths, to other devices (e.g., a steam generator of a power plant, a collector for storing heat for later use, and the like). Thus, the cell array receives light only at a selected wavelength, and the rest of the solar radiation is directed elsewhere and may be further utilized for other purposes. The mere direction of the rest of the solar radiation, prevents unnecessary overheating of the cell arrays, thereby reducing the required cooling power, and increases the efficiency of the entire system.

Figure 12:
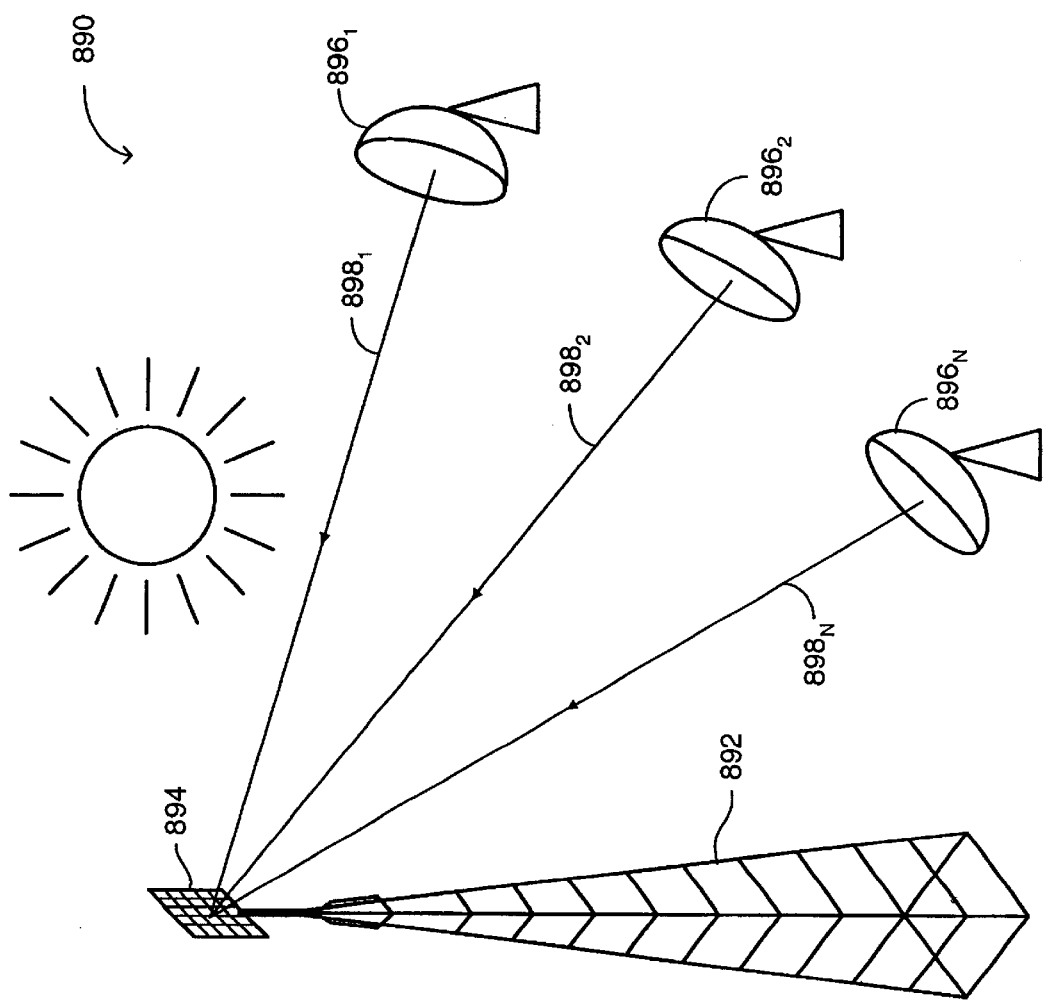
FIG. 12 is a schematic illustration of a solar energy system, constructed and operative in accordance with another embodiment of the disclosed technique.

Reference is now made to FIG. 12, which is a schematic illustration of a solar energy system, generally referenced 890, constructed and operative in accordance with another embodiment of the disclosed technique. System 890 includes a tower 892, a cell array 894 and a plurality of mirrors $896_1$, $896_2$ and $896_N$. Cell array 894 is mounted on top of tower 892 and mirrors $896_1$, $896_2$ and $896_N$ are located on the ground. Mirrors $896_1$, $896_2$ and $896_N$ concentrate solar light beams $898_1$, $898_2$ and $898_N$, respectively, at cell array 894.

It is noted that the cell array according to the disclosed technique, can be incorporated with other different aspects of the disclosed technique and in different combinations of these aspects. For example, the cell array can be incorporated with a solar energy system, such as solar energy system 780 (FIG. 10C) or solar energy system 890 (FIG. 12), whose sun tracking control system is either open loop or closed loop. In the same sun tracking control system, the cell array can be incorporated with a light concentrator, such as light concentrator 550 (FIG. 6A). Alternatively, the cell array can be incorporated with a stationary mirror (i.e., a dish).

According to another aspect of the disclosed technique, the circuit for coupling together the cells is modified during the operation of the cell array, such that the current generated by the cell array is maximum at all times. Thus, if one or more of the cells malfunctions or produces a lower current for example, due to the change in flux of light, then the circuit is modified accordingly, thereby enabling the cell array to generate the maximum possible current.

Figure 13A:
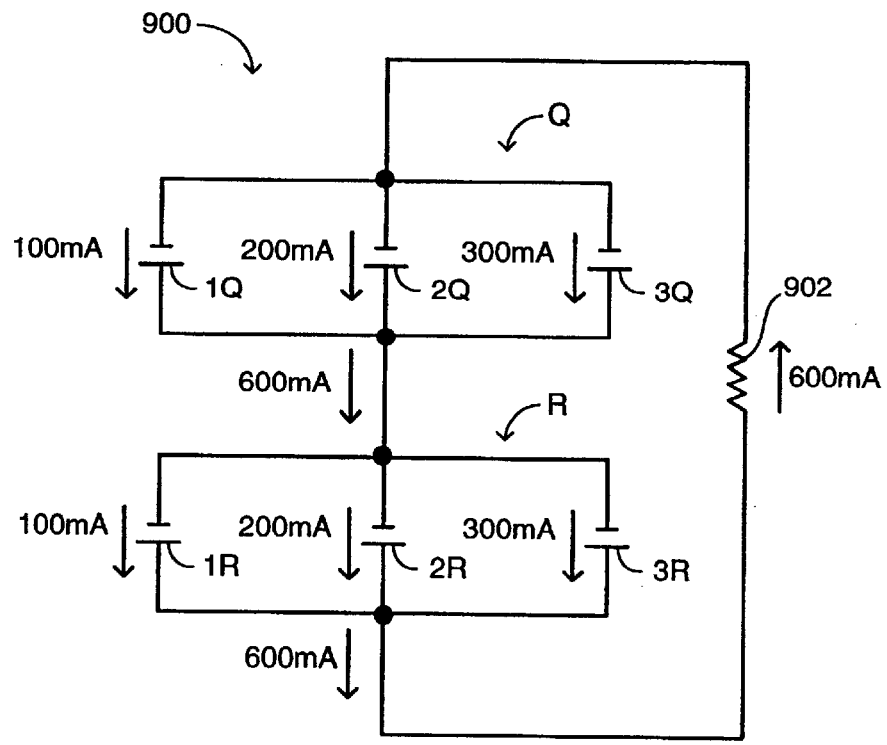
FIG. 13A is a schematic illustration of a plurality of cells, coupled together in a circuit, constructed and operative in accordance with a further embodiment of the disclosed technique.
Figure 13B:
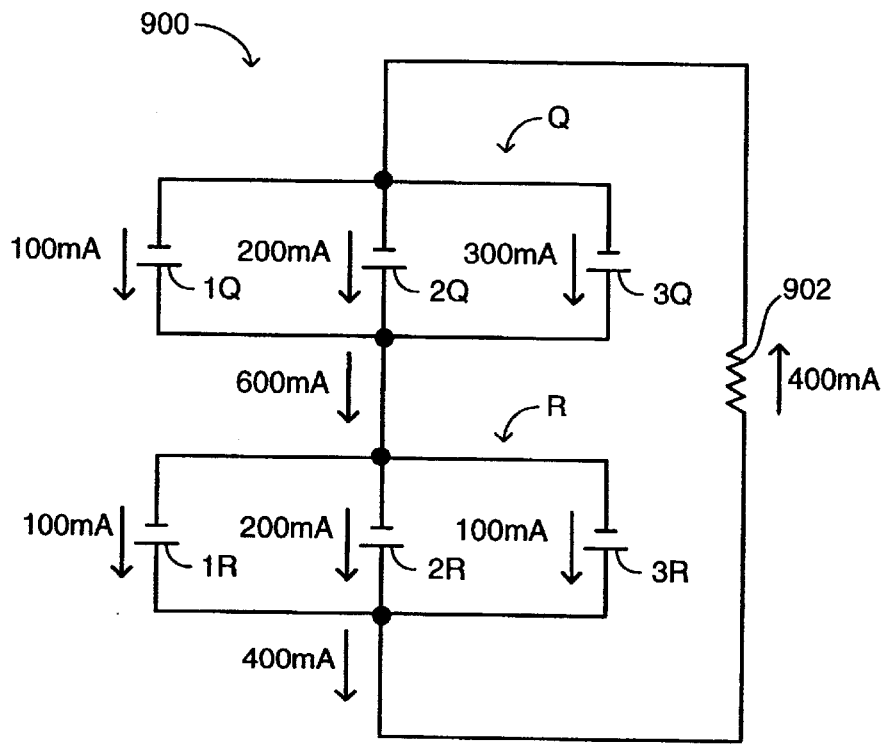
FIG. 13B is a schematic illustration of the circuit of FIG. 13A, in which the output current of one of the cells has fallen.
Figure 13C:
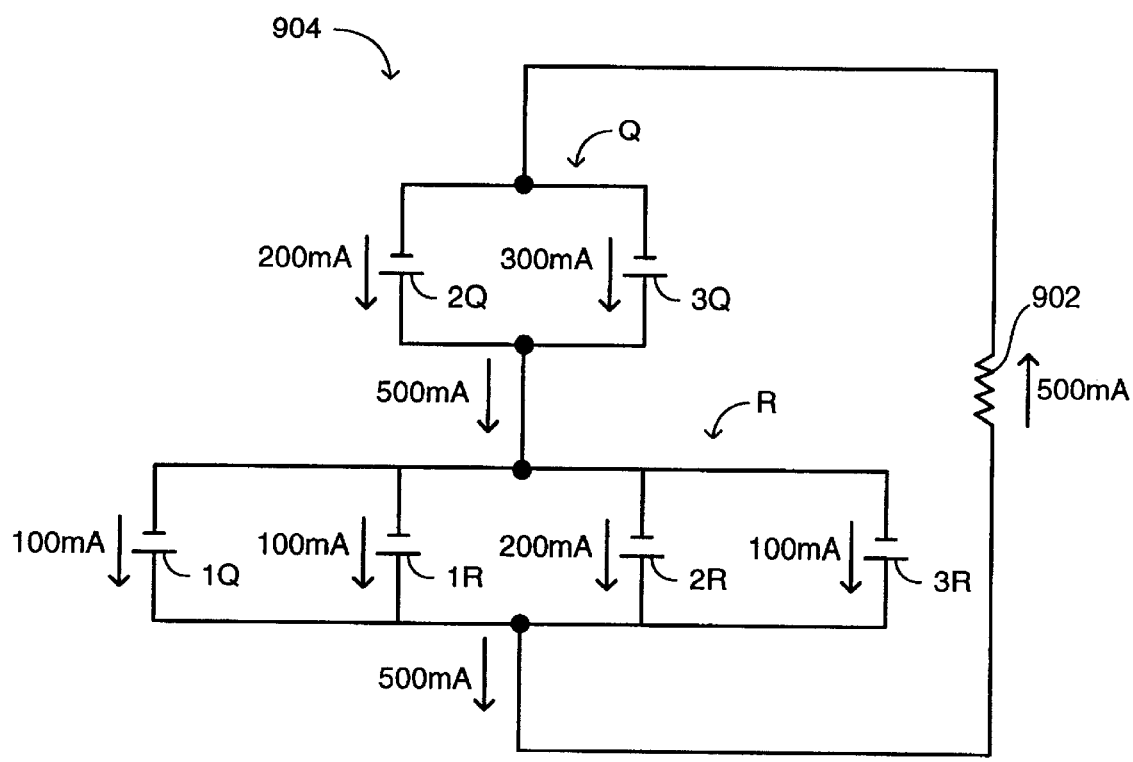
FIG. 13C is a schematic illustration of the cells of FIG. 13B, coupled together in a circuit, constructed and operative in accordance with another embodiment of the disclosed technique.

Reference is now made to FIGS. 13A, 13B and 13C. FIG. 13A is a schematic illustration of a plurality of cells, coupled together in a circuit generally referenced 900, constructed and operative in accordance with a further embodiment of the disclosed technique. FIG. 13B is a schematic illustration of the circuit of FIG. 13A, in which the output current of one of the cells has fallen. FIG. 13C is a schematic illustration of the cells of FIG. 13B, coupled together in a circuit generally referenced 904, constructed and operative in accordance with another embodiment of the disclosed technique.

With reference to FIG. 13A, circuit 900 includes two groups Q and R and a load 902. Group Q includes cells 1Q, 2Q and 3Q. Group R includes cells 1R, 2R and 3R. Groups Q and R are coupled in series with load 902. Cells 1Q, 2Q and 3Q are coupled together in series. Cells 1R, 2R and 3R are coupled together in series.

Cells 1Q, 2Q and 3Q produce currents of 100 mA, 200 mA and 300 mA, respectively. Cells 1R, 2R and 3R produce currents of 100 mA, 200 mA and 300 mA, respectively. The output current of group Q is 600 mA (i.e., the sum of 100 mA, 200 mA and 300 mA). The output current of group R is 600 mA (i.e., the sum of 100 mA, 200 mA and 300 mA). Hence, a current of 600 mA flows through load 902.

With reference to FIG. 13B, the output current of cell 3R falls to 100 mA, due to a reduction in the light flux which reaches cell 3R, a malfunction in cell 3R, and the like. Group Q still produces 600 mA, while the output current of group R falls to 400 mA (i.e., the sum of 100 mA, 200 mA and 100 mA). The output current of low-current-producing group R, negatively influences the current flowing through load 902, by restricting this current to 400 mA and thus, the current which flows through load 902, falls from 600 mA (FIG. 13A), to 400 mA.

With reference to FIG. 13C, the couplings between the cells of FIG. 13B are modified as in circuit 904, in order to increase the current flowing through load 902. According to this modification, cell 1Q is discoupled from cells 2Q and 3Q and coupled in series with cells 1R, 2R and 3R. Thus, group Q includes cells 2Q and 3Q and group R includes cells 1Q, 1R, 2R and 3R.

The output current of group Q is 500 mA (i.e., the sum of 300 mA and 200 mA). The output current of group R is 500 mA (i.e., the sum of 100 mA, 100 mA, 100 mA and 200 mA). Circuit 904 includes no low-current-producing group and the current flowing through load 902 rises from 400 mA (FIG. 13B), to 500 mA. Thus, the output power of a plurality of cells can be increased, by modifying the couplings between the same cells.

Figure 14A:
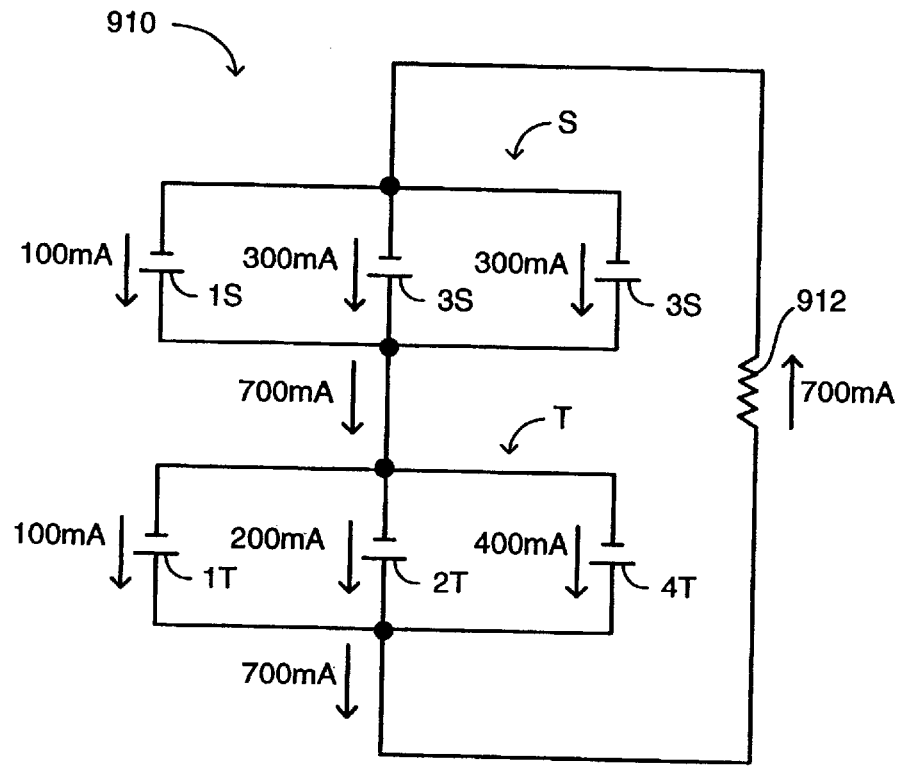
FIG. 14A is a schematic illustration of a plurality of cells, coupled together in a circuit, constructed and operative in accordance with a further embodiment of the disclosed technique.
Figure 14B:
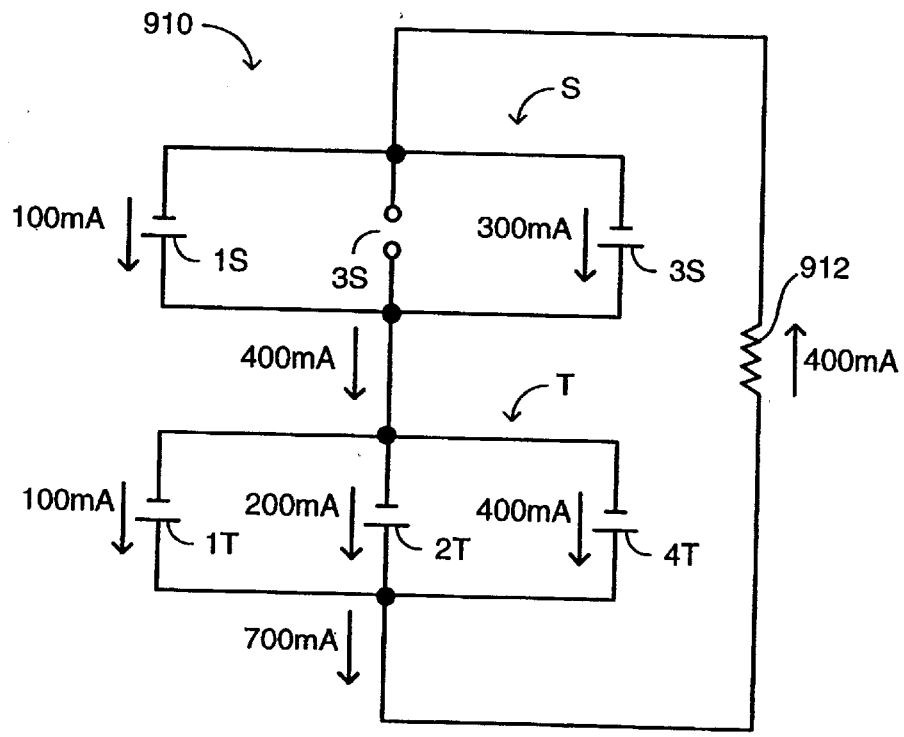
FIG. 14B is a schematic illustration of the circuit of FIG. 14A, in which one of the cells has failed.
Figure 14C:
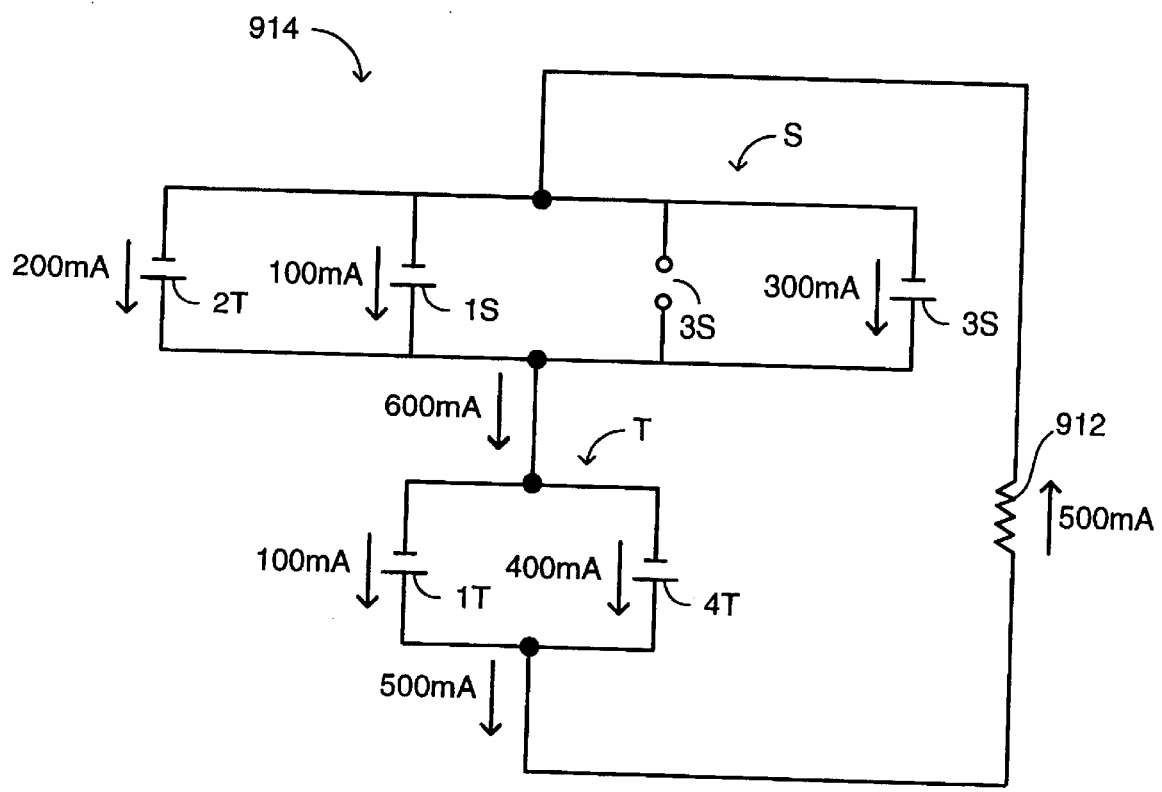
FIG. 14C is a schematic illustration of the cells of FIG. 14B, coupled together in a circuit, constructed and operative in accordance with another embodiment of the disclosed technique.

Reference is now made to FIGS. 14A, 14B and 14C. FIG. 14A is a schematic illustration of a plurality of cells, coupled together in a circuit generally referenced 910, constructed and operative in accordance with a further embodiment of the disclosed technique. FIG. 14B is a schematic illustration of the circuit of FIG. 14A, in which one of the cells has failed. FIG. 14C is a schematic illustration of the cells of FIG. 14B, coupled together in a circuit generally referenced 914, constructed and operative in accordance with another embodiment of the disclosed technique.

With reference to FIG. 14A, circuit 910 includes two groups S and T and a load 912. Group S includes a cell 1S and two cells 3S. Group T includes cells 1T, 2T and 4T. Groups S and T are coupled in series with load 912. Cell 1S and the two cells 3S are coupled together in series. Cells 1T, 2T and 4T are coupled together in series.

Cell 1S produces a current of 100 mA and each of the cells 3S produces a current of 300 mA. Cells 1T, 2T and 4T produce currents of 100 mA, 200 mA and 400 mA, respectively. The output current of group S is 700 mA (i.e., the sum of 100 mA, 300 mA and 300 mA). The output current of group T is 700 mA (i.e., the sum of 100 mA, 200 mA and 400 mA). Hence, a current of 700 mA flows through load 912.

With reference to FIG. 14B, one of the cells 3S fails. Now, group S includes one cell 1S which produces a current of 100 mA, a dead cell 3S which produces no current and a working cell 3S which produces a current of 300 mA. Group T still produces 700 mA, while the output current of group S falls to 400 mA (i.e., the sum of 100 mA and 300 mA). The output current of low-current-producing group S, negatively influences the current flowing through load 912 by restricting this current to 400 mA and thus, the current through load 912 falls from 700 mA (FIG. 14A), to 400 mA.

With reference to FIG. 14C, the couplings between the cells of FIG. 14B are modified as in circuit 914, in order to increase the current flowing through load 912. According to this modification, cell 2T is discoupled from cells 1T and 4T and coupled in series with cell 1S, dead cell 3S and the working cell 3S. Thus, group S includes cells 2T, 1S, the dead cell 3S and the working cell 3S. Group T includes cells 1T and 4T.

The output current of group S is 600 mA (i.e., the sum of 200 mA, 100 mA and 300 mA). The output current of group T is 500 mA (i.e., the sum of 100 mA and 400 mA). Circuit 914 includes group S which produces a current of 600 mA and group T which produces a current of 500 mA. The current flowing through load 912 is restricted to 500 mA (i.e., the lower of the output currents of the two groups S and T), however this current is greater than 400 mA (FIG. 14B). Thus, the output power of a plurality of cells can be increased, by modifying the couplings between the same cells.

According to another aspect of the disclosed technique, the couplings between the cells can be changed dynamically, when the flux of the concentrated light which reaches these cells, changes. Thus, at all times those cells which produce the same current are coupled together.

Figure 15:
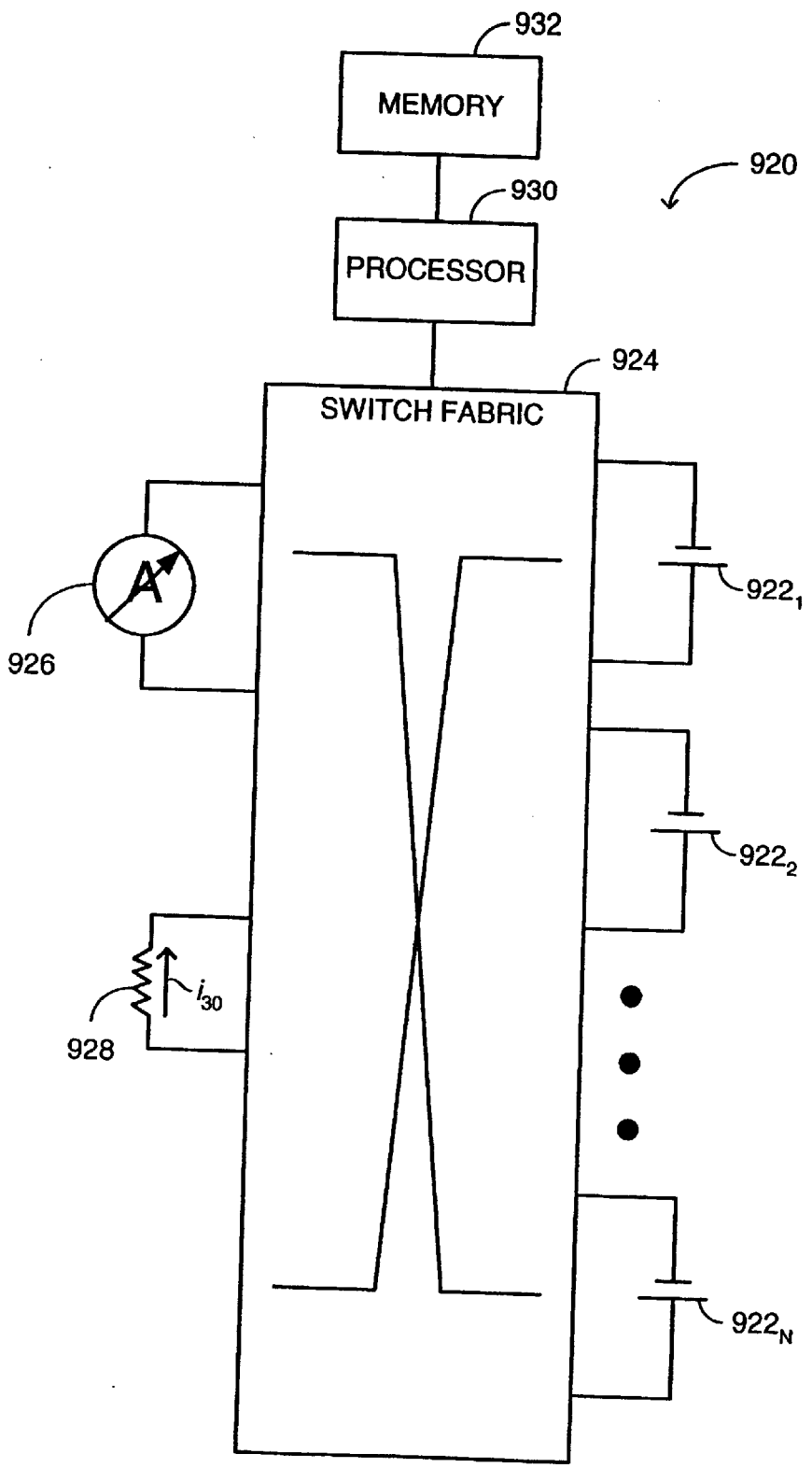
FIG. 15 is a schematic illustration of a system for dynamically coupling together a plurality of cells, constructed and operative in accordance with a further embodiment of the disclosed technique.

Reference is now made to FIG. 15, which is a schematic illustration of a system for dynamically coupling together a plurality of cells, generally referenced 920, constructed and operative in accordance with a further embodiment of the disclosed technique. System 920 includes a plurality of cells $922_1$, $922_2$ and $922_N$, a switch fabric 924, an ammeter 926, a load 928, a processor 930 and a memory 932.

The two leads of each of the cells $922_1$, $922_2$ and $922_N$, of ammeter 926 and of load 928, are coupled with switch fabric 924. Processor 930 is coupled with switch fabric 924 and to memory 932. Switch fabric 924 provides the electrical couplings between the cells $922_1$, $922_2$ and $922_N$, ammeter 926 and load 928. When cells $922_1$, $922_2$ and $922_N$ are illuminated, a current $i_{30}$ flows through load 928. An optimization program for maximizing the value of $i_{30}$ is stored in memory 932.

When one or more of cells $922_1$, $922_2$ and $922_N$ malfunctions or generates a low current, (i.e., it is a low-current-producing cell), current $i_{30}$ flowing through load 928, falls by a certain amount according to couplings between the cells $922_1$, $922_2$ and $922_N$ and load 928, at that time. Processor 930 runs the optimization program at selected intervals (e.g., every half an hour). According to this optimization program, processor 930 directs switch fabric 924 to sequentially couple the leads of ammeter 926 across each of the cells $922_1$, $922_2$ and $922_N$, thereby measuring the instantaneous current produced by each of the cells $922_1$, $922_2$ and $922_N$. Processor 930 processes the measured currents and according to the outcome of the optimization program, directs switch fabric 924 to modify the couplings between the cells $922_1$, $922_2$ and $922_N$, and load 928. As a consequence of this modification, the negative influence of the low-current-producing cell on the value of current $i_{30}$ is minimized and the value of current $i_{30}$ flowing through load 928 is maximized. Thus, the output power of cells $922_1$, $922_2$ and $922_N$ is increased.

Figure 16:
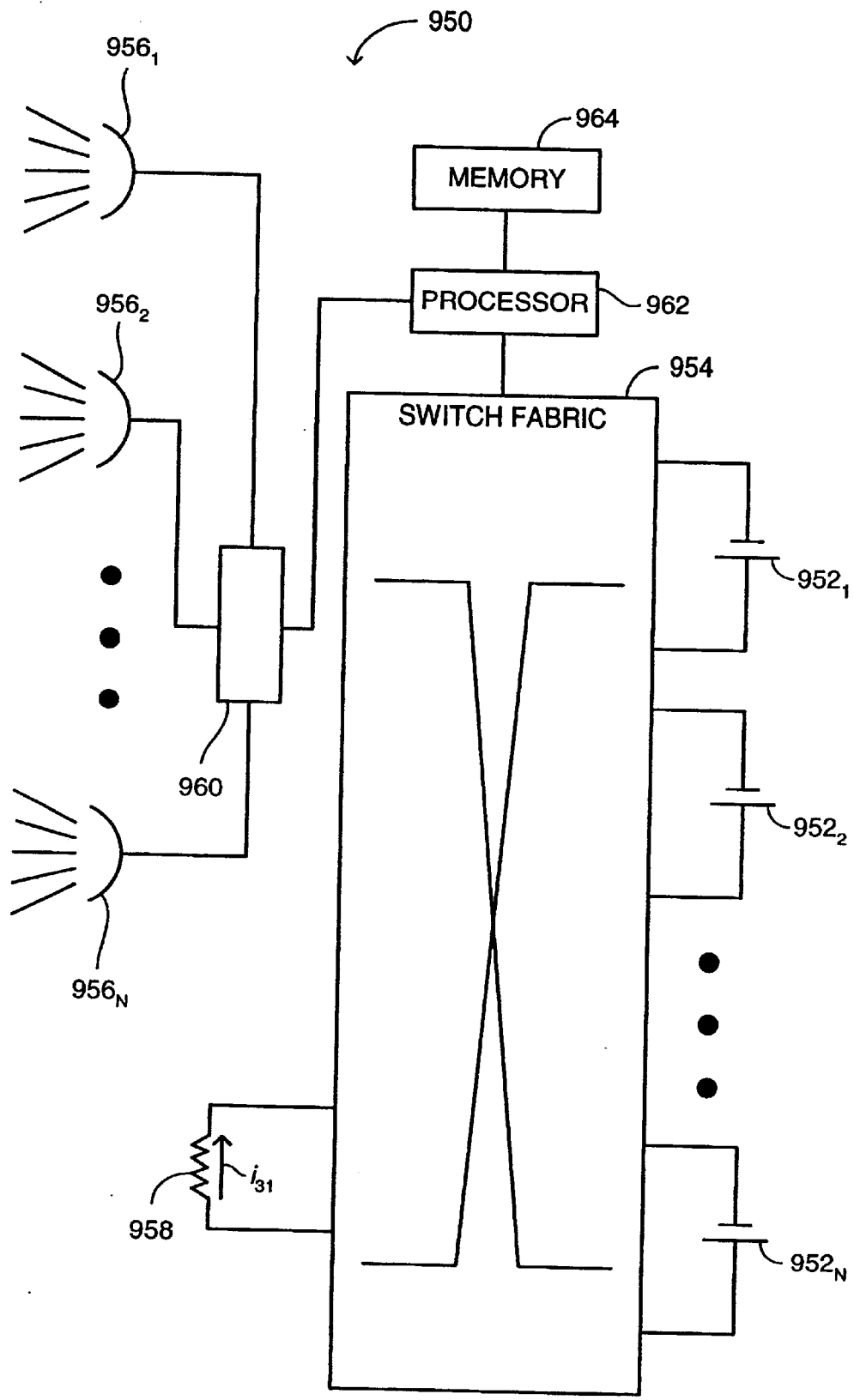
FIG. 16 is a schematic illustration of a system for dynamically coupling together a plurality of cells, constructed and operative in accordance with another embodiment of the disclosed technique.

Reference is now made to FIG. 16, which is a schematic illustration of a system for dynamically coupling together a plurality of cells, generally referenced 950, constructed and operative in accordance with another embodiment of the disclosed technique. System 950 includes a plurality of cells $952_1$, $952_2$ and $952_N$, a switch fabric 954, a plurality of flux meters $956_1$, $956_2$ and $956_N$, a load 958, a multiplexer 960, a processor 962 and a memory 964. Each of the flux meters $956_1$, $956_2$ and $956_N$ is stationary and measures the flux of light, which reaches a cell. Multiplexer 960 receives a plurality of signals, multiplexes the signals and provides an output signal, which sequentially represents each of these signals.

The two leads of each of the cells $952_1$, $952_2$ and $952_N$, and of load 958, are coupled with switch fabric 954. Flux meters $956_1$, $956_2$ and $956_N$ are coupled with multiplexer 960. Processor 962 is coupled with switch fabric 954, to memory 964 and to multiplexer 960.

Switch fabric 954 provides the electrical couplings between the cells $952_1$, $952_2$ and $952_N$, and load 958. When cells $952_1$, $952_2$ and $952_N$ are illuminated, a current $i_{31}$ flows through load 958. An optimization program for maximizing the value of $i_{31}$ is stored in memory 964.

Each of the flux meters $956_1$, $956_2$ and $956_N$ sends a signal to multiplexer 960, respective of the measured light flux reaching each of the cells $952_1$, $952_2$ and $952_N$. Multiplexer 960 sequentially sends a flux signal respective of each of the flux meters $956_1$, $956_2$ and $956_N$, to processor 962.

A low-current-producing cell can produce a lower current, when there is a fall in the flux of light which reaches the cell. Consequently, current $i_{31}$ flowing through load 958, falls by a certain amount according to couplings between the cells $952_1$, $952_2$ and $952_N$ and load 958. Processor 962 runs the optimization program at selected intervals (e.g., every half an hour). Processor 962 processes the flux signal received from multiplexer 960 and according to the outcome of the optimization program, directs switch fabric 954 to modify the couplings of the cells $952_1$, $952_2$ and $952_N$, and load 958. As a consequence of this modification, the negative influence of the low-current-producing cell on the value of current $i_{31}$ is minimized and the value of current $i_{31}$ flowing through load 958 is maximized. Thus, the output power of cells $952_1$, $952_2$ and $952_N$ is increased.

Alternatively, only one flux meter instead of the plurality of flux meters $956_1$, $956_2$ and $956_N$ is coupled with the processor. This flux meter is mobile and sequentially measures the light flux reaching each of a plurality of cells. Further alternatively, a plurality of mobile flux meters are coupled with the processor, for measuring the light flux reaching each of the cells.

It is noted that either processor 930 (FIG. 15) or processor 962 (FIG. 16), can be coupled with sun tracking control system 790 (FIG. 10A). In this case, the processor directs the sun tracking control system to move the mirror such that the flux of light reaching each of the cells is maximal.

Figure 17:
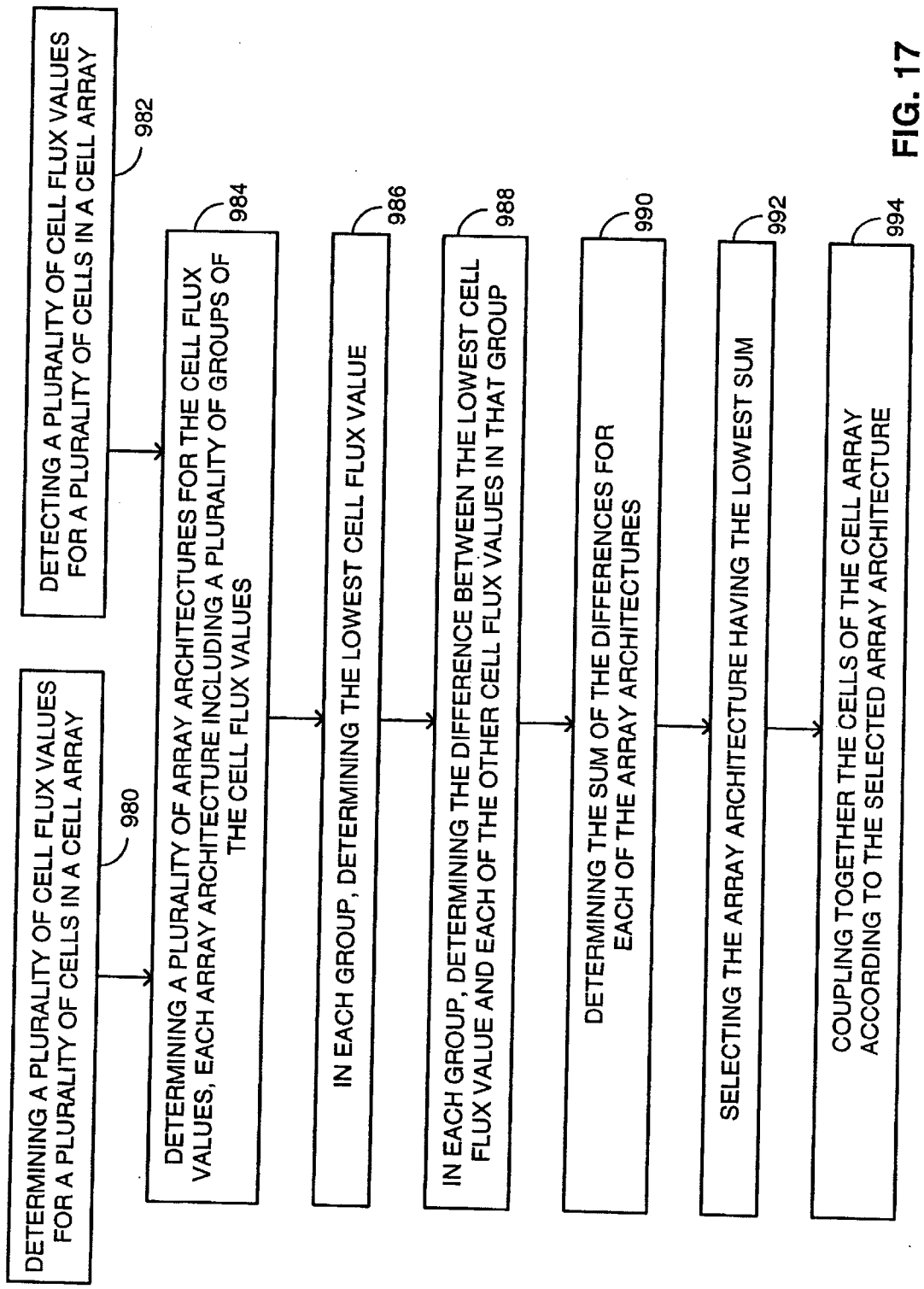
FIG. 17 is a schematic illustration of a method for constructing a solar cell array, operative in accordance with a further embodiment of the disclosed technique.

Reference is now made to FIG. 17, which is a schematic illustration of a method for constructing a solar cell array, operative in accordance with a further embodiment of the disclosed technique. In the description herein below, the term "cell flux value" can be replaced with other parameters, such as the current generated by the cell (which is also a representation of the flux), which are related to the actual flux of light reaching a particular cell. In procedure 980, a plurality of cell flux values are determined for a plurality of cells in a cell array. With reference to FIG. 4A, the flux of light which reaches each of the cells of cell array 350, is determined according to the distribution of the light on the cell array. The distribution of the light is determined for example, according to the geometry of the lens assembly, or the mirror, which focuses the light on the cell array.

In procedure 982, a plurality of cell flux values are detected for a plurality of cells in a cell array. With reference to FIG. 15, ammeter 926 sequentially detects the current flowing through each of the cells $922_1$, $922_2$ and $922_N$. This current represents the flux of light which reaches a particular cell. Alternatively, with reference to FIG. 16, flux meters $956_1$, $956_2$ and $956_N$ detect the flux of light which reaches cells $952_1$, $952_2$ and $952_N$, respectively. It is noted that entire procedure is either alternative or complementary to procedure 980.

In procedure 984, a plurality of array architectures are determined for the cell flux values, wherein each array architecture includes a plurality of groups of cell flux values. Each of the array architectures is basically a different way of coupling the cells together. With reference to FIG. 4A, the cells of cell array 350 are divided to groups and sub-groups. For example, Quadrant I of cell array 350 is divided to groups 354 and 356, and sub-groups 358, 360, 362 and 364. In description according to FIG. 4A, the term "sub-group" also refers to a group. Each group includes a plurality of cells and likewise each sub-group includes a plurality of cells. According to this embodiment, the cells within each group are coupled together in series and the groups in each array architecture are coupled in parallel to a load. An example of such an array architecture is circuit 102 (FIG. 1B).

It is noted that since the cells within a group are coupled together in series, there is little significance to the order in which they are coupled together and hence, different permutations of the same group may not be considered with respect to flux efficiency aspects. This significantly reduces the number of array architectures to be inspected, as described herein below.

In procedure 986, the lowest cell flux value in each group of each array architecture, is determined. In procedure 988, the difference between the lowest cell flux value and each of the other cell flux values in each of the groups of each of the array architectures, is determined. In procedure 990, the sum of the differences for each of the array architectures is determined. In procedure 992, the array architecture having the lowest sum of the differences is selected. In procedure 994, the cells of the cell array, such as cell array 350 (FIG. 4A), are coupled together according to the selected array architecture.

It is noted that the difference between the lowest cell flux value and another cell flux value in a group, represents the flux (i.e., the current) which is wasted in that group. This is so, because the output current of a group whose cells are coupled together in series, is limited by the cell in this group which generates the lowest current. Thus, among a plurality of groups, the one having the lowest sum of the differences, is also the one having the lowest wasted flux and the one which generates the highest current. In like manner, among a plurality of array architectures (i.e., different circuits for coupling together a plurality of cells in a cell array), the array architecture having the lowest sum of the differences, is also the one which brings the cell array to generate the highest current.

Figure 18:
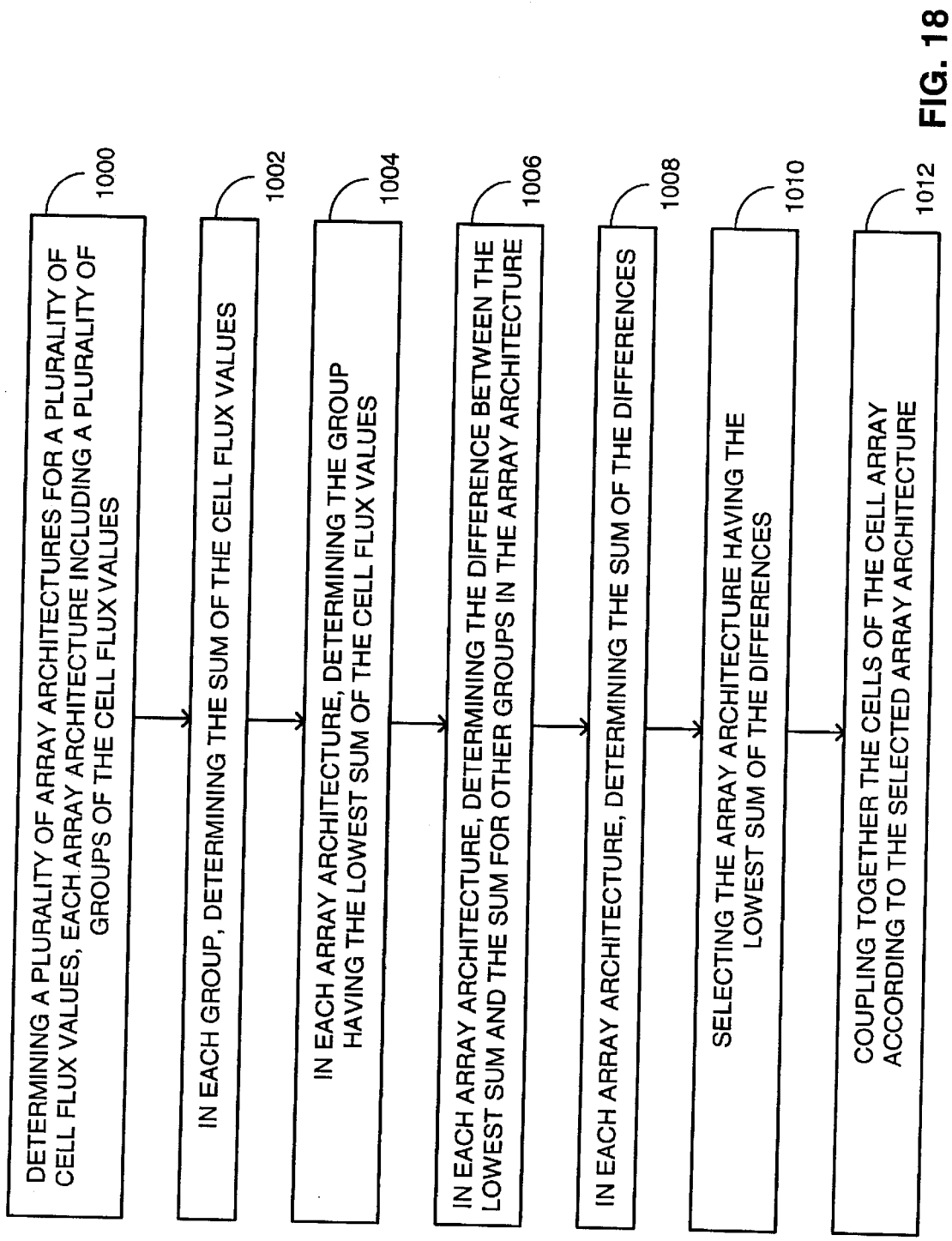
FIG. 18 is a schematic illustration of a method for constructing a solar cell array, operative in accordance with another embodiment of the disclosed technique.

Reference is now made to FIG. 18, which is a schematic illustration of a method for constructing a solar cell array, operative in accordance with another embodiment of the disclosed technique. In procedure 1000, a plurality of array architectures for a plurality of cell flux values are determined, wherein each array architecture includes a plurality of groups of these cell flux values. These array architectures are similar to those described herein above in procedure 984 of FIG. 17, except that the cells within each group of each array architecture are coupled together in parallel and the groups in each array architecture are coupled in series with a load. An example of such an array architecture is circuit 180 (FIG. 3).

In procedure 1002, the sum of the cell flux values in each group of each array architecture is determined. In procedure 1004, the group in each array architecture having the lowest sum of the cell flux values, is determined. In procedure 1006, the difference between the lowest sum in each array architecture and all the other sums in the same array architecture, is determined. In procedure 1008, the sum of the differences in each array architecture is determined. In procedure 1010, the array architecture having the lowest sum of the differences, is selected and in procedure 1012, the cells of the cell array are coupled together according to the selected array architecture.

It is noted that since the groups of cells in the cell array are coupled together in series with the load, the current flowing through the load is limited by the group which generates the lowest current. The difference between this lowest current and all the other currents generated by the other groups in the cell array, represents the wasted flux. Hence, the circuit in which the sum of the differences is the least, has the lowest waste and generates the most current, in terms of utilizing the available flux.

It is further noted that not in all cases is it physically possible to couple together the cells of the cell array, according to the most optimal array architecture which is selected according to the method described herein above in connection with either FIG. 17 or 18, or a combination thereof. This is so, because of the difficulty inherent in coupling together the cells located on different regions of the cell array and collecting the electrical wires in one bundle. Thus, in some cases it is preferable to couple together the cells, according to an array architecture which is the most optimal one, within the imposed connection limitations.

It will be appreciated by persons skilled in the art that the disclosed technique is not limited to what has been particularly shown and described hereinabove. Rather the scope of the disclosed technique is defined only by the claims, which follow.

What is claimed is:

1. Energy converting system comprising:
   at least one cell array; and
   at least one light concentrating unit unevenly directing concentrated light at said at least one cell array, said at least one cell array comprising at least one parallel connected group coupled in parallel within said at least one cell array, each said parallel connected group comprising at least two series connected groups coupled in series within said parallel connected group;

each said series connected group comprising at least one photovoltaic cell coupled in parallel within said series connected group, each said series connected group having a series group flux value associated therewith, said series group flux value being the sum of flux values incident on the at least one photovoltaic cell of said series connected group, wherein for each of said at least one parallel connected group, said respective at least two series connected groups are selected such that differences between said selected series connected group series group flux values are minimal.

2. The system according to claim 1, further comprising at least one optical structure made of a transparent material, said optical structure comprising: a first surface receiving said at least one cell array; a second surface receiving said concentrated light; and a two-dimensional array of prismatic bodies located between said first surface and said second surface, wherein each of said prismatic bodies tapers toward said first surface.

3. The system according to claim 2, wherein each of said prismatic bodies diverts said concentrated light which is directed toward a gap between any two of said cells, to said two cells.

4. The system according to claim 2, wherein each of said prismatic bodies diverts the light from a high-flux region which is directed toward at least one of said cells, to other cells adjacent to said at least one cell.

5. The system according to claim 2, herein a plurality of electrical wires coupled with said cells, pass through the grooves formed by every two of said prismatic bodies.

6. The system according to claim 2, wherein a plurality of electrical wires coupled with said cells, pass through the gaps between every two of said cells, toward a bottom portion of said cells.

7. The system according to claim 1, wherein the bottom surface of said at least one cell array is coupled with a cooling compartment, said cooling compartment comprising: an inlet; an outlet; and a plurality of perforated layers having substantially identical shapes and dimensions, wherein said perforated layers are stacked in a direction parallel to said bottom surface, wherein said perforated layers are alternately offset in said direction, thereby forming a plurality of fluid paths, and wherein a cooling fluid flows from said inlet to said outlet, via said fluid paths.

8. The system according to claim 7, wherein the boundary of each of said perforated layers is perforated.

9. The system according to claim 7, wherein an electrical insulator is located between said bottom surface and said cooling compartment.

10. The system according to claim 7, wherein the size of each one of a plurality of perforations in each of said perforated layers, is substantially greater than the distance between every two of said perforations.

11. The system according to claim 1, further comprising: an ammeter; a processor; and a switch fabric coupled with said ammeter, said cells and to said processor, wherein said processor directs said switch fabric to couple said ammeter to each of said cells, disconnectably, thereby measuring the current in each of said cells, wherein said processor processes said measured currents, wherein said processor selects an array architecture, and wherein said processor directs said switch fabric to couple said cells together, according to said selected array architecture.

12. The system according to claim 11, wherein said processor determines a modified array architecture, by processing said measured currents when at least one of said currents changes, and wherein said processor directs said switch fabric to couple said cells together, according to said modified array architecture.

13. The system according to claim 1, further comprising: a processor; a plurality of flux meters coupled with said processor, each of said flux meters measuring the flux value of said concentrated light reaching a different one of said cells; and a switch fabric coupled with said cells, and to said processor, wherein said processor processes said measured flux values, wherein said processor selects an array architecture, and wherein said processor directs said switch fabric to couple said cells together, according to said selected array architecture.

14. The system according to claim 13, wherein said processor determines a modified array architecture, by processing said measured flux values when at least one of said flux values changes, and wherein said processor directs said switch fabric to couple said cells together, according to said modified array architecture.

15. The system according to claim 1, further comprising: at least one moving mechanism coupled with said at least one light concentrating unit; and a sun tracking system coupled with said at least one moving mechanism, for directing said at least one moving mechanism to move said at least one light concentrating unit, such that said at least one light concentrating unit tracks the sun.

16. The system according to claim 15, wherein said sun tracking system is selected from the group consisting of: closed loop; and open loop.

17. The system according to claim 15, further comprising a processor coupled with said sun tracking system and to at least one detector, wherein said at least one detector detects the flux of said concentrated light reaching each of said cells, wherein said processor processes the values of said flux, and wherein said processor directs said sun tracking system to move said at least one light concentrating unit, such that said flux is maximal.

18. The system according to claim 1, wherein said at least one light concentrating unit is selected from the group consisting of: lens; lens assembly; light guide; and concave mirror.

19. The system according to claim 18, wherein said concave mirror comprises a plurality of curved reflective plates, wherein a different one of said curved reflective plates directs said concentrated light toward a different region of said at least one cell array.

20. The system according to claim 15, wherein said sun tracking system detects the current generated by each of said cells, and wherein said sun tracking system directs said at least one moving mechanism to move said at least one light concentrating unit, according to said detected currents.

21. The system according to claim 20, wherein said sun tracking system directs said at least one moving mechanism to move said at least one light concentrating unit, by comparing said detected currents with a value.

22. The system according to claim 21, wherein said value is the sum of said detected currents.

23. The system according to claim 20, wherein said sun tracking system directs said at least one moving mechanism to move said at least one light concentrating unit, by comparing selected ones of said detected currents with selected other ones of said detected currents.

24. The system according to claim 15, further comprising at least one flat reflective plate, located at an slanted angle relative to the surface of said at least one cell array, wherein said at least one flat reflective plate directs a portion of said concentrated light falling exterior to said surface, back toward said surface.

25. The system according to claim 1, further comprising a wavelength separator, wherein said wavelength separator receives a multiwavelength light, and wherein said wavelength separator separates said multiwavelength light to a plurality of light beams at different wavelengths, and wherein said wavelength separator directs each of said light beams toward a different one of said at least one light concentrating unit.

26. The system according to claim 25, wherein said wavelength separator is selected from the group consisting of: prism; splitter; and filter.

27. The system according to claim 1 wherein a selected one of said at least one cell array is located on top of a tower, and wherein a plurality of light concentrating units located on the ground, direct said concentrated light at said selected cell array.

28. Method for coupling together a plurality of cells in a cell array, the method comprising the procedures of:
defining, for said plurality of cells, a plurality of array architectures each having at least one parallel connected group for coupling in parallel within said cell array, each said parallel connected group including at least two series connected groups for coupling in series within said parallel connected group, each said series connected group including at least one of said cells for coupling in parallel within said series connected group;
defining a series group flux value for each series connected group as the sum of flux values of light incident on the at least one cell of each said series connected group; and
selecting one of the plurality of array architectures that has a minimal difference between said series group flux values of said at least two series connected groups of each of said at least one parallel connected group.

29. The method according to claim 28, further comprising a preliminary procedure of determining said flux values of light incident on each of said plurality of cells.

30. The method according to claim 28, further comprising a preliminary procedure of detecting said flux values of light incident on each of said plurality of cells.

31. The method according to claim 28, further comprising a procedure of coupling together said cells according to said selected array architecture.

32. The method according to claim 29, wherein said cell flux values are determined according to the distribution of light on said cell array.

33. The method according to claim 30, wherein said cell flux values are detected by a device selected from the group list consisting of: ammeter; and flux meter.

34. The method according to claim 33, wherein said procedure of detecting comprises the procedures of: coupling said ammeter to a selected one of said cells; detecting a cell flux value of said selected cell; discoupling said ammeter from said selected cell; and repeating said procedure of coupling said ammeter, for other ones of said cells.

35. The method according to claim 31, wherein said procedure of coupling is performed when the distribution of light reaching said cells changes.

36. Method for coupling together a plurality of cells in a cell array, the method comprising the procedures of:
determining the sum of a plurality of cell flux values of said cells, in each of a plurality of groups, of each one of a plurality of array architectures;
determining one of said groups in each one of said array architectures, said group having a lowest sum of said cell flux values;
determining the difference between said lowest sum and said sums in other ones of said groups, of each one of said array architectures; and
selecting an array architecture such that said differences are minimal.

37. The method according to claim 36, further comprising a preliminary procedure of determining said array architectures for said cell flux values, wherein each of said array architectures includes said groups, and wherein each of said groups includes selected ones of said cell flux values of each of said cells.

38. The method according to claim 37, further comprising a preliminary procedure of determining said cell flux values.

39. The method according to claim 37, further comprising a preliminary procedure of detecting said cell flux values.

40. The method according to claim 36, further comprising a procedure of coupling together said cells according to said selected array architecture.

41. The method according to claim 40, wherein selected cells in each of said groups are coupled together in parallel.

42. The method according to claim 40, wherein said procedure of coupling is performed when the distribution of light reaching said cells changes.

43. Energy converting system comprising:

means for converting light to electricity, said means for converting light to electricity comprising at least one parallel connected group coupled in parallel within said means for converting light to electricity; and means for unevenly directing concentrated light onto said means for converting light to electricity, each said parallel connected group including at least two series connected groups coupled in series within said parallel connected group, each said series connected group including at least one photovoltaic means coupled in parallel within said series connected group, each said series connected group having a series group flux value associated therewith, said series group flux value being the sum of flux values incident on the at least one photovoltaic means included in said series connected group, wherein for each of said at least one parallel connected group, said respective at least two series connected groups are selected such that the differences between said selected series connected group series group flux values are minimal.

* * * * *